United States Patent
Li et al.

(10) Patent No.: US 11,626,541 B2
(45) Date of Patent: Apr. 11, 2023

(54) DISPLAY MODULE, DISPLAY SCREEN AND DISPLAY SYSTEM

(71) Applicant: Ledman Optoelectronic Co., Ltd., Shenzhen (CN)

(72) Inventors: Mantie Li, Shenzhen (CN); Weiquan Fang, Shenzhen (CN); Xiaojun An, Shenzhen (CN); Jun Li, Shenzhen (CN); Yuanting Xue, Shenzhen (CN)

(73) Assignee: LEDMAN OPTOELECTRONIC CO., LTD., Shenzhen (CN)

( * ) Notice: Subject to any disclaimer, the term of this patent is extended or adjusted under 35 U.S.C. 154(b) by 214 days.

(21) Appl. No.: 17/088,279

(22) Filed: Nov. 3, 2020

(65) Prior Publication Data
US 2021/0050486 A1 Feb. 18, 2021

Related U.S. Application Data

(63) Continuation of application No. PCT/CN2018/085644, filed on May 4, 2018.

(51) Int. Cl.
*H01L 33/48* (2010.01)
*H01L 25/075* (2006.01)
(Continued)

(52) U.S. Cl.
CPC ........ *H01L 33/483* (2013.01); *H01L 25/0753* (2013.01); *H01L 33/58* (2013.01); *H01L 33/62* (2013.01); *G09G 3/32* (2013.01)

(58) Field of Classification Search
CPC ... H01L 33/483; H01L 25/0753; H01L 33/58; H01L 33/62
See application file for complete search history.

(56) References Cited

U.S. PATENT DOCUMENTS

| 5,949,581 A | 9/1999 | Kurtenbach et al. ........ 359/621 |
| 6,169,632 B1 * | 1/2001 | Kurtenbach ............. G09F 9/33 |
| | | 359/620 |

(Continued)

FOREIGN PATENT DOCUMENTS

| CN | 201716941 U | 1/2011 |
| CN | 102163392 A | 8/2011 |

(Continued)

OTHER PUBLICATIONS

International Search Report dated Jan. 30, 2019, issued by the National Intellectual Property Administration in corresponding application PCT/CN2018/0856644.

(Continued)

*Primary Examiner* — Jay C Chang
*Assistant Examiner* — Mikka Liu
(74) *Attorney, Agent, or Firm* — Stein IP, LLC

(57) ABSTRACT

A display module, a display screen and a display system are disclosed. The display module comprises a frame and multiple display unit boards assembled and installed on the frame to form a display surface. The frame comprises a border and a support frame installed in the border. Each display unit board comprises a circuit board and multiple pixel points installed on a front side of the circuit board, wherein a back side of the circuit board is installed on the border and the support frame, and each pixel point includes at least one LED chip. According to the display module of the invention, multiple display unit boards are assembled on the frame to form a display surface.

16 Claims, 20 Drawing Sheets

(51) Int. Cl.
  *H01L 33/58* (2010.01)
  *H01L 33/62* (2010.01)
  *G09G 3/32* (2016.01)

(56) References Cited

U.S. PATENT DOCUMENTS

| | | | |
|---|---|---|---|
| 2011/0019348 A1 | 1/2011 | Kludt et al. | ............. 361/679.01 |
| 2017/0202098 A1 | 7/2017 | Gou et al. | |
| 2018/0031919 A1 | 2/2018 | Ryu et al. | |

FOREIGN PATENT DOCUMENTS

| | | | |
|---|---|---|---|
| CN | 203607050 U | | 5/2014 |
| CN | 104141862 A | * | 11/2014 |
| CN | 104141862 A | | 11/2014 |
| CN | 106448479 A | | 2/2017 |
| EP | 3 193 321 A1 | | 8/2016 |
| JP | 2005-10661 A | | 1/2005 |
| JP | 2006-145890 A | | 6/2006 |
| JP | 2006-184561 A | | 7/2006 |
| JP | 2011-53313 A | | 3/2011 |
| JP | 2013-537005 A | | 9/2013 |
| JP | 2017-126059 A | | 7/2017 |
| WO | WO 2014/104913 A1 | | 7/2014 |

OTHER PUBLICATIONS

Examination Report No. 1 For Your Standard Patent Application dated Jul. 2, 2021, issued by the Australian Patent Office in corresponding application AU 2018421489.
Examination Report No. 2 For Your Standard Patent Application dated Feb. 2, 2022, issued by the Australian Patent Office in corresponding application AU 2018421489.
Canadian Office Action dated Nov. 5, 2021, issued by the Canadian Patent Office in corresponding application CA 3,099,251.
Extended European Search Report dated Feb. 1, 2022, issued by the European Patent Office in corresponding application EP 18917554.0.
English Office Action dated Mar. 14, 2022, issued by the Intellectual Property Office of the United Kingdom in corresponding application UK 2018546.8.
English Office Action dated Aug. 26, 2022, issued by the Intellectual Property Office of the United Kingdom in corresponding application UK 2018546.8.

* cited by examiner

DISPLAY MODULE, DISPLAY SCREEN AND DISPLAY SYSTEM

CROSS-REFERENCE TO RELATED APPLICATIONS

This application is a continuation of International Patent Application No. PCT/CN2018/085644, filed on May 4, 2018 in the China National Intellectual Property Administration. The disclosures of the aforementioned applications are hereby incorporated by reference in their entireties.

BACKGROUND OF THE INVENTION

1. Technical Field

The invention relates to the technical field of LED display, in particular to a display module, a display screen and a display system.

2. Description of the Related Art

Display modules in the prior art include a circuit board and plug-in LED lamp beads or surface-mounted LED lamp beads installed on the circuit board, wherein the circuit board and the lamp beads thereon form a display unit board. Generally, one display module has only one display unit board. With the continuous development of small dot pitches, highly integrated display unit boards are designed by directly integrating LED chips on circuit boards. However, due to the small area of the highly integrated display unit boards, multiple display unit boards have to be assembled together to form a display surface when a display module is manufactured. Thus, there is an urgent need to provide a display module assembled from multiple display unit boards.

SUMMARY OF THE INVENTION

The main objective of the invention is to provide a display module which is assembled from multiple display unit boards.

To fulfill the aforesaid objective, the invention provides a display module which comprises a frame and multiple display unit boards, wherein the multiple display units are assembled and installed on the frame to form a display surface. The frame comprises a border and a support frame installed in the border. Each display unit board comprises a circuit board and multiple pixel points installed on a front side of the circuit board, wherein a back side of the circuit board is bonded to the border and the support frame, and each pixel point includes at least one LED chips.

To fulfill the aforesaid objective, the invention further provides a display screen which comprises a bottom case and display modules installed in the bottom case. Two or more display modules are assembled to form a display surface. Each display module comprises a frame and multiple display unit boards, wherein the multiple display unit boards are assembled and installed on the frame to form a display surface. The frame comprises a border and a support frame installed in the border. Each display unit board comprises a circuit board and multiple pixel points installed on a front side of the circuit board, wherein a back side of the circuit board is bonded to the border and the support frame, and each pixel point includes at least one LED chip.

To fulfill the aforesaid objective, the invention further provides a display module which comprises multiple display unit boards arranged in sequence, a frame and a back cover, wherein the multiple display unit boards are assembled and installed on the frame to form a display surface, and the frame is installed on the back cover and comprises a border and a support frame installed in the border. Each display unit board comprises a circuit board and multiple pixel points installed on a front side of the circuit board, wherein a back side of the circuit board is installed on the border and the support frame, and each pixel point includes at least one LED chip.

To fulfill the aforesaid objective, the invention further provides a display screen which comprises a box and display modules installed on the box, wherein two or more display modules are assembled to form a display surface. Each display module comprises multiple display unit boards arranged in sequence, a frame and a back cover, wherein the multiple display unit boards are installed on the frame to form a display surface, and the frame is installed on the back cover and comprises a border and a support frame installed in the border. Each display unit board comprises a circuit board and multiple pixel points installed on a front side of the circuit board, wherein a back side of the circuit board is installed on the border and the support frame, and each pixel point includes at least one LED chip.

To fulfill the aforesaid objective, the invention further provides a display system, comprising a support and display screens installed on the support. Two or more display screens are assembled to form a display surface. Each display screen is the display screen mentioned above.

According to the technical solutions of the invention, multiple display unit boards are disposed and assembled on the frame to form a display surface and are installed on the border and the support frame of the frame, so that assembly is easy, the process is simple and reliable, the assembly uniformity is guaranteed, and seams between the display unit boards are reduced.

DETAILED DESCRIPTION OF THE SEVERAL VIEWS OF THE DRAWINGS

To more clearly explain the technical solutions of the embodiments of the invention or of the prior art, drawings used for describing the embodiments of the invention or the prior art will be briefly introduced below. Obviously, the drawings in the following description are merely for illustrating some embodiments of the invention. Those ordinarily skilled in the art can obtain other drawings according to the structures illustrated by the following drawings without any creative labor.

FIG. 24a-FIG. 24b are schematic diagrams of pre-maintenance of the display screen in

Figure 19:
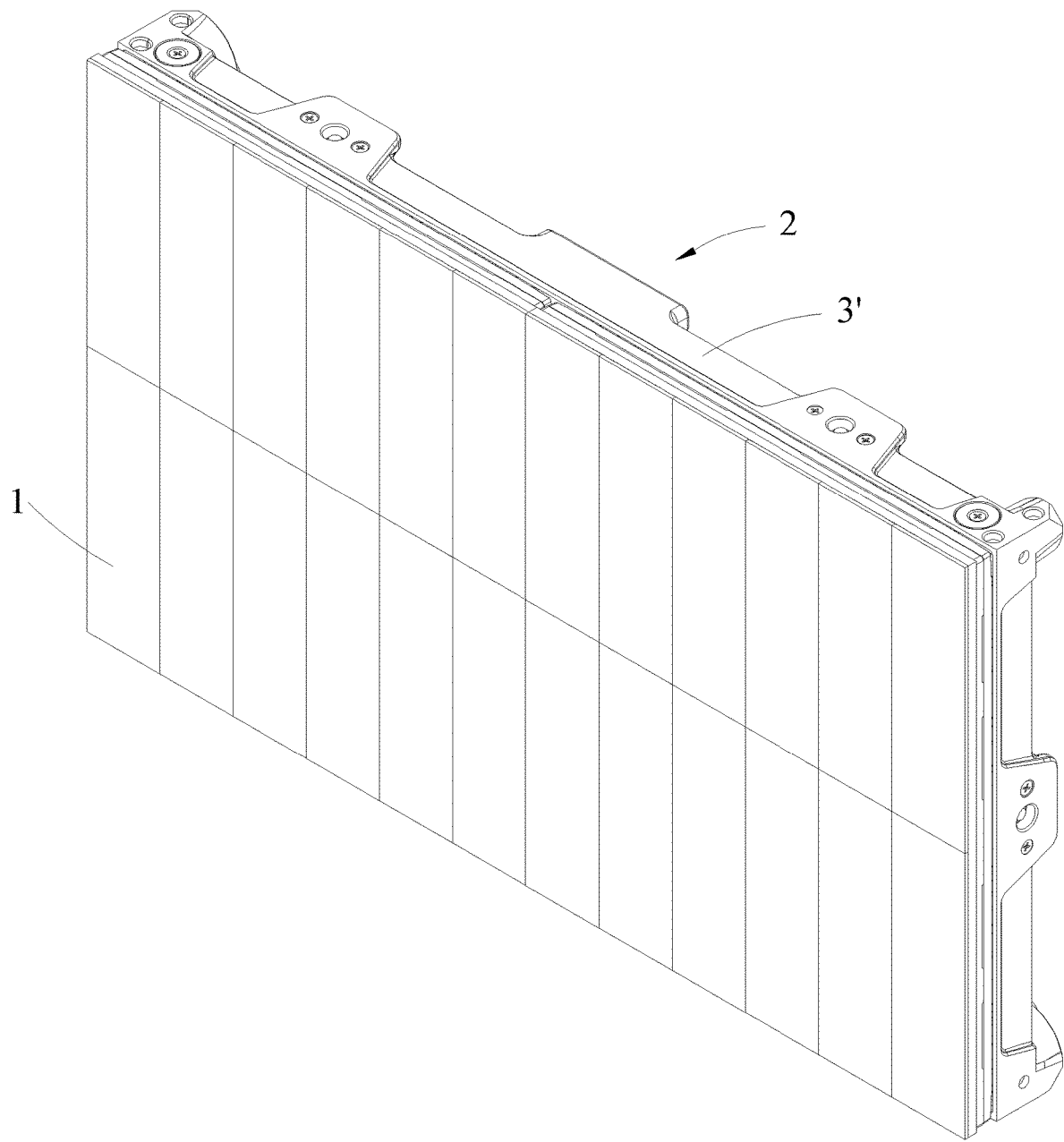
FIG. 19 is a structural view of a fifth embodiment of the display screen of the invention.
Figure 20:
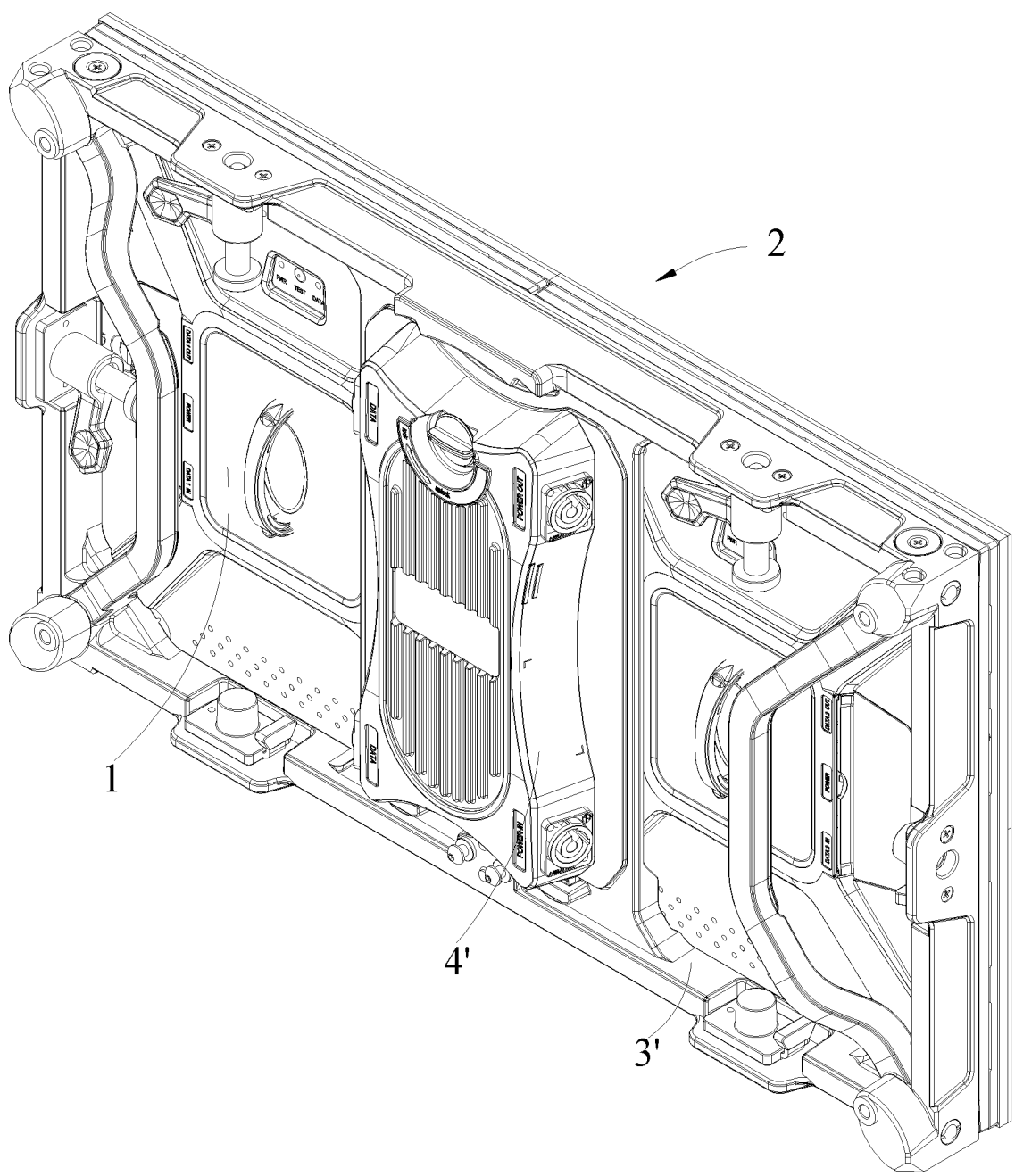
FIG. 20 is a structural view of the display screen in FIG. 19 from another perspective.
Figure 25A:
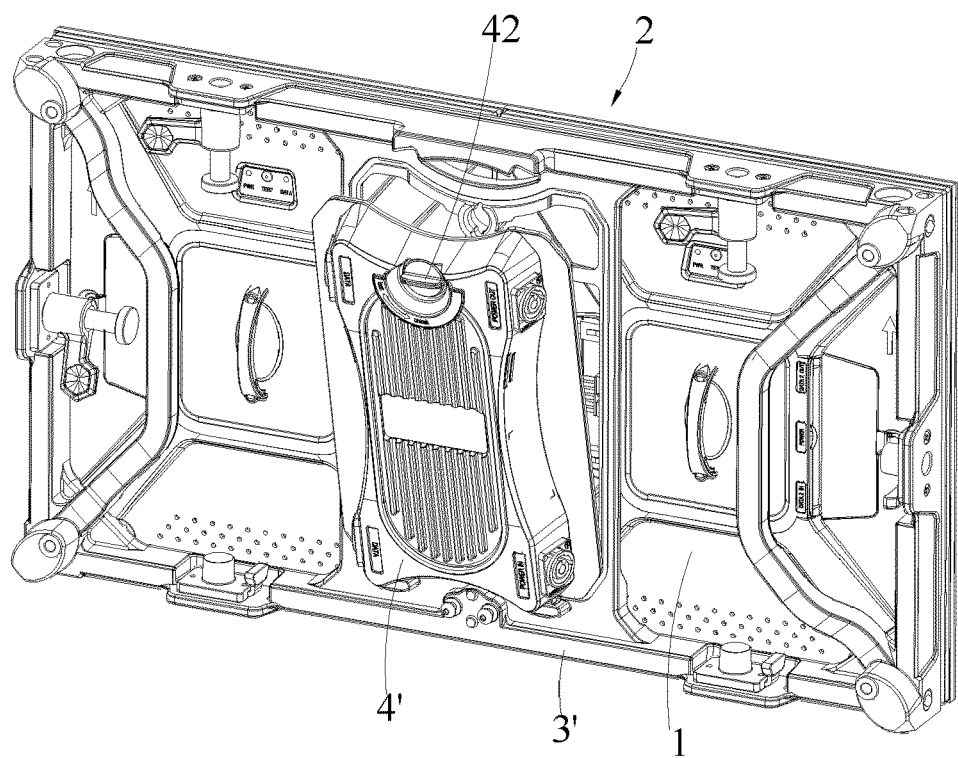
Figure 25B:
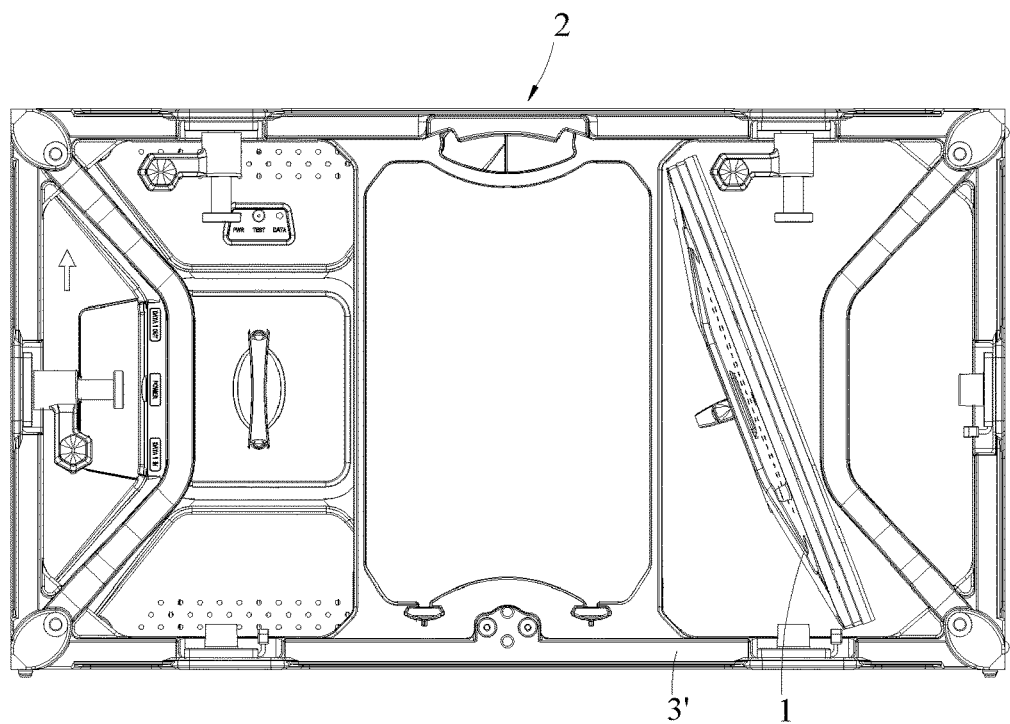
Figure 26:
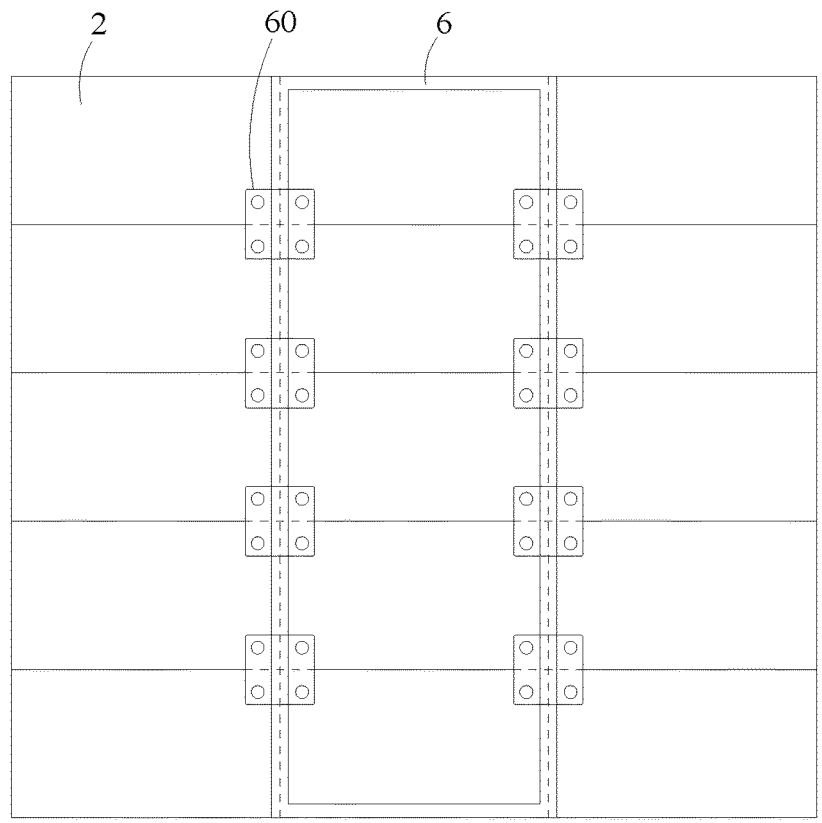

FIG. 19;

FIG. 25a-FIG. 25b are schematic diagrams of post-maintenance of the display screen in FIG. 19;

FIG. 26 is a schematic diagram of one embodiment of a display system of the invention.

The realization of the purposes of the invention, and the functional features and advantages of the invention will be further explained with reference to the embodiments and accompanying drawings.

DETAILED DESCRIPTION OF THE INVENTION

The technical solutions of the embodiments of the invention will be clearly and completely described below in conjunction with the accompanying drawings of the embodiments of the invention. Obviously, the embodiments in the following description are merely illustrative ones, and are not all possible ones of the invention. All other embodiments obtained by those ordinarily skilled in the art based on the following ones without creative labor should also fall within the protection scope of the invention.

It should be noted that all directional indications in the embodiments of the invention (such as "upper", "lower", "left", "right", "front", "back", etc.) are merely for explaining relative positional relations between different components or motion conditions of these component at a specific pose (as illustrated). If the specific pose changes, the directional indications shall change accordingly.

In addition, the terms such as "first" and "second" involved in the invention are merely for the purpose of description, and do not indicate or imply relative importance or implicitly indicate the number of technical features referred to. Therefore, a feature defined by "first" and "second" may explicitly or imply indicates that at least one of this feature is included. In addition, the technical solutions of different embodiments can be combined as long as it is available for those ordinarily skilled in the art, and any contradictory or unachievable combinations of the technical solutions should be regarded as nonexistent ones and are not included in the protection scope of the invention.

The invention provides a display module. Referring to FIG. 1 to FIG. 4, in a first embodiment, the display module 1 comprises a frame 10 and multiple display unit boards 11, wherein the multiple display unit boards 11 are assembled and installed on the frame 10 to form a display surface. The frame 10 comprises a border 100 and a support frame 102 installed in the border 100. Each display unit board 11 comprises a circuit board 110 and multiple pixel points installed on a front side of the circuit board 110, wherein a back side of the circuit board 110 is installed on the border 100 and the support frame 102, and each pixel point includes at least one LED chip 112.

According to the display module 1 in this embodiment, the multiple display unit boards 11 are assembled on the frame 10 to form the display surface and are installed on the border 100 and the support frame 102 of the frame 10, so that assembly is easy, the process is simple and reliable, the assembly uniformity is guaranteed, and seams between the display unit boards 11 are reduced.

It should be noted that, in the invention, the back sides of the circuit boards 110 may be installed on the frame 10 by means of screw connection or bonding, or in other manners. For example, copper pillars are welded on the back sides of the circuit boards 110 and are connected to the frame 10 with screws. The support frame 102 is of a criss-cross structure, an obliquely crossed structure or other structures, is used for supporting and carrying the back sides of the circuit boards 110, and coordinates with the border 100 to assemble and install the multiple display unit boards 11. Clearly, components on the back sides of the circuit boards 110 should avoid the support frame 102.

In this embodiment, the display module 1 further comprises a switch board 12 and a main receiving card 13, wherein the switch board 12 is installed on a side, away from the display unit boards 11, of the support frame 102 and is electrically connected to the multiple display unit boards 11, and the main receiving card 13 is installed on a side, away from the support frame 102, of the switch board 12.

The main receiving card 13 is installed on and electrically connected to the switch board 12, receives and processes data, and then transmits processed data to each display unit board 11 to realize data display. Wherein, the main receiving card 13 is a receiving card and may also be called a receiving control card or a control card, and the switch board 12 is also called a Hub board.

In this embodiment, the main receiving card 13 is installed on the switch board 12 in a plugged manner through connectors, and thus can be easily assembled and disassembled and quickly plugged and unplugged. Moreover, to further fix the main receiving card 13 on the switch board 12, the main receiving card 13 is locked on the switch board 12 with screws. Preferably, the main receiving card 13 is provided with two rows of female connectors, the switch board 12 is provided with two rows of male connectors, and the female connectors of the main receiving card 13 are plugged and matched with the male connectors of the switch board 12. In other embodiments, the main receiving card 13 may be connected to the switch board 12 through a cable.

In this embodiment, the switch board 12 is provided with a first input interface 120 and a first output interface 122 electrically conductive with the main receiving card 13. The first input interface 120 is used for inputting data, the main receiving card 13 receives and processes the input data, and processed data is displayed by the display surface formed by the multiple display unit boards 11. The first output interface 122 is used for outputting the processed data to the next display module 1. Preferably, the first input interface 120 and the first output interface 122 are both network interfaces. In addition, first cooling fins may be disposed on a master chip of the main receiving card 13 to cool the master chip, so as to improve the stability of the master chip and prolong the service life of the master chip.

In this embodiment, the switch board 12 is provided with a power interface 124 for inputting power, wherein DC power is input via the power interface 124 to be supplied to the whole display module 1. Specifically, a 4.5V DC voltage is input via the power interface 124 to supply power to each display unit board 11 through the switch board 12. It should be noted that the input DC voltage can be regulated as actually needed, and is not limited to 4.5V.

In this embodiment, a first connector 111 is disposed on the back side of the circuit board 110 of each display unit board 11, multiple second connectors 126 are disposed on the switch board 12, and each first connector 111 is connected to one second connector 126 in a plugged manner, so that the switch board 12 transmits data and power to each display unit board 11 through the second connectors 126 and the first connectors 111 to realize the display function of the display module 1. Preferably, the first connectors 111 are male connectors, and the second connectors 126 are female connectors. In other embodiments, the first connectors 111 may be female connectors, and the second connectors 126 may be male connectors. In addition, the switch board 12 is fixed on the support frame 102 with screws to prevent the first connectors 111 from disengaging from the second connectors 126 under vibrations in the transport process, and thus, data and power transmission will not be affected.

In this embodiment, the support frame 102 is of the criss-cross and coordinates with the border 100 to form multiple installation frames, and the periphery of the circuit board 110 of each display unit board 11 is bonded to one installation frame.

Compared with the manner of installing the display unit boards 11 with screws, the manner of installing the display unit boards 11 by bonding is simple, quick and efficient. In addition, the peripheries of the circuit boards 110 are bonded to the installation frames, so that the edges of the circuit boards 110 can be fully used, the clearance on the back sides of the circuit boards 110 is reduced, and the configuration of components on the back sides of the circuit boards 110 is facilitated. Clearly, every two adjacent display unit boards 11 share one part of the support frame 102.

Preferably, in this embodiment, the support frame 102 comprises a first beam (not marked) and n second beams (not marked), wherein the first beam is perpendicularly connected with the midpoints of two opposite edges of the border 100 and the midpoints of all the second beams, and each second beam is perpendicularly connected with two opposite edges of the border 100. Wherein, n may be, but not limited to, 3, 4, 5 or 6, and correspondingly, the number of the display unit boards 11 may be, but not limited to, 8, 10, 12 or 14. Clearly, the display unit boards 11 are supported on the border 100, the first beam and the second beams.

In this embodiment, to reduce the consumption of raw materials, the weight of the support frame 102 and the cost, grooves 103 are formed in a side, away from the display unit boards 11, of the support frame 102, that is, the grooves 103 are formed in one side of the first beam and in one side of each second beam. Moreover, to guarantee the strength of the support frame 102, the grooves 103 do not extend to joints of the first beam and the second beams.

In this embodiment, the display module 1 further comprises an iron sheet 15, which is disposed between the support frame 102 and the switch board 12 and allows a pre-maintenance tool to be magnetically attracted thereto, such that the pre-maintenance tool can be magnetically attracted to the iron sheet 15 to realize pre-maintenance of the display module 1.

In this embodiment, the display module 1 further comprises multiple magnet assemblies 14. Multiple installation grooves 104 are formed in the side, away from the display unit boards 11, of the support frame 102. Each magnet assembly 14 is separably installed in one installation groove 104. The display module 1 can be magnetically installed on a bottom case 3 or a box through the magnet assemblies 14 and can be easily assembled and disassembled, and pre-maintenance of the display module 1 is realized.

Preferably, in this embodiment, the installation grooves 104 are close to different corners of the border 100, are not communicated with the grooves 103 and are formed in the two outermost second beams of the support frame 102. Each magnet assembly 14 comprises a magnet and a screw penetrating through the magnet to fix the magnet in one installation groove 104. The number of the installation grooves 104 and the number of the magnet assemblies 14 are four.

Figure 1:
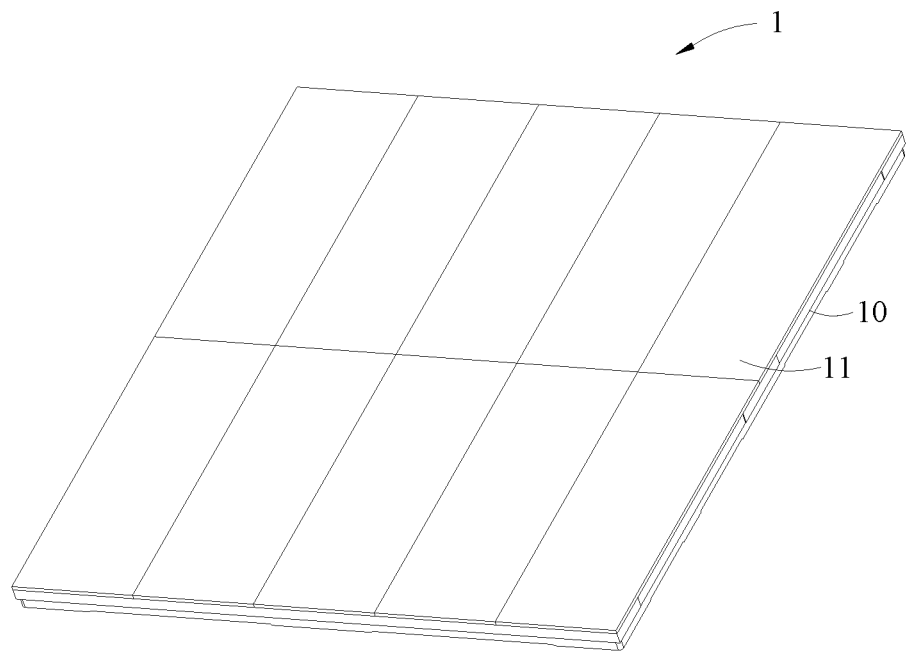
FIG. 1 is a structural view of a first embodiment of a display module of the invention.
Figure 2:
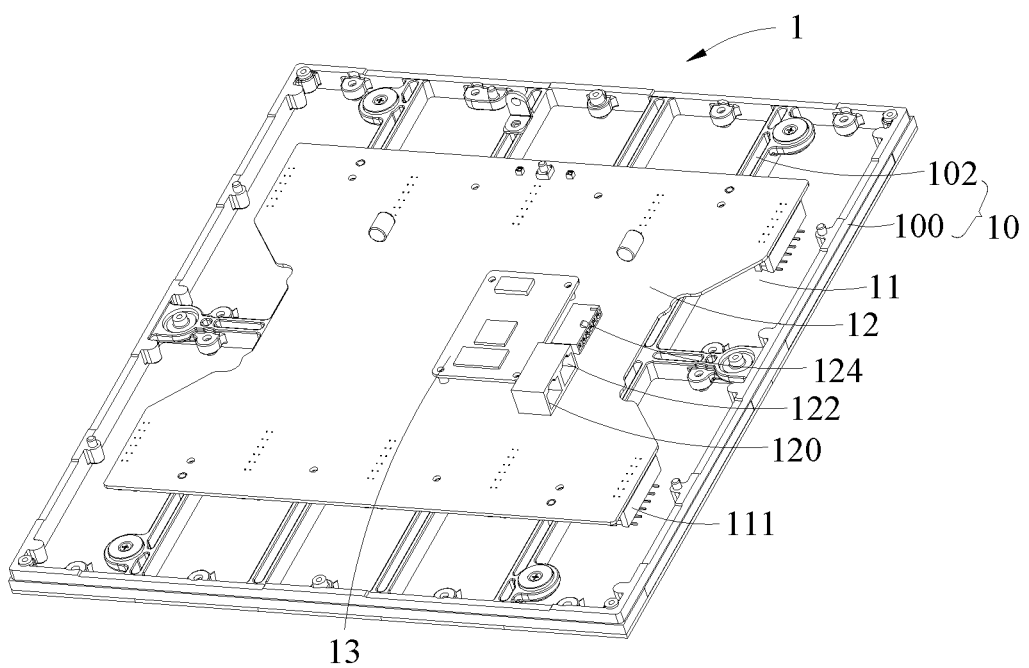
FIG. 2 is a structural view of the display module in FIG. 1 from another perspective.
Figure 3:
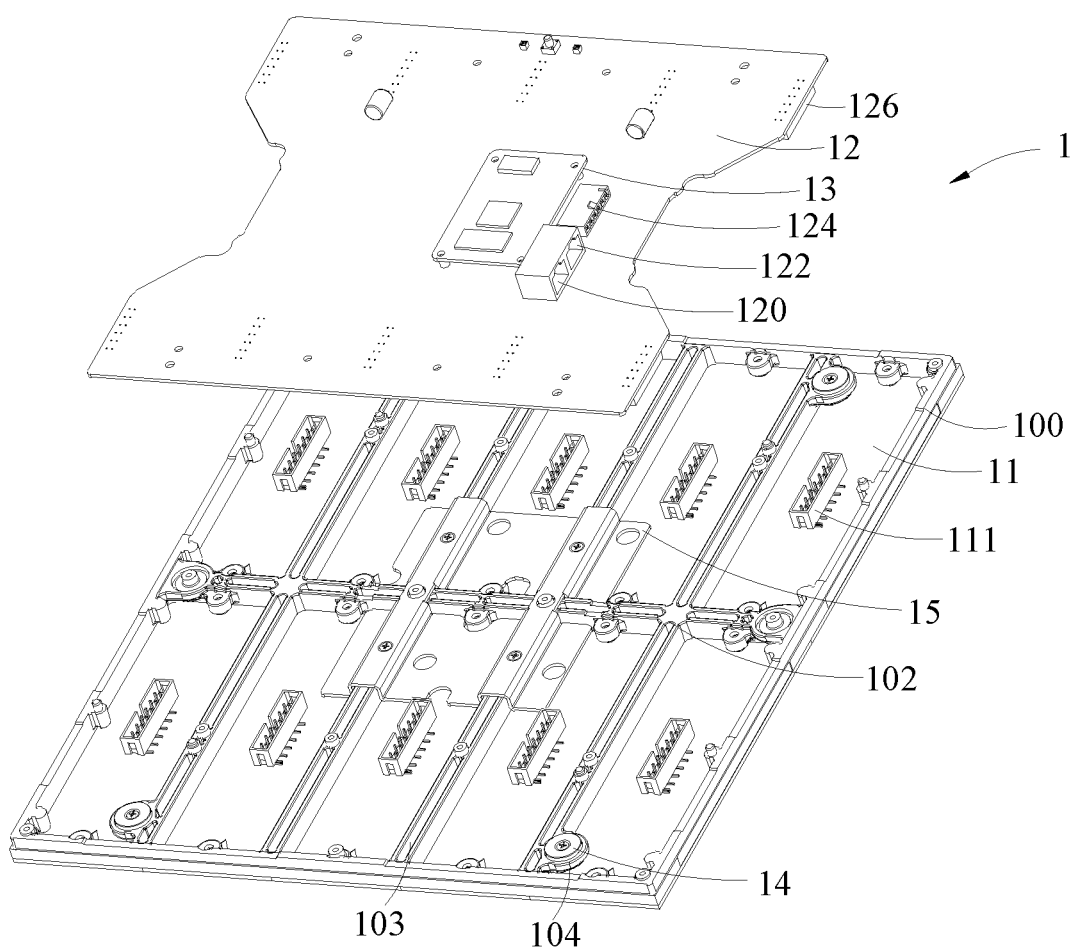
FIG. 3 is an exploded view of the display module in FIG. 2.
Figure 4:
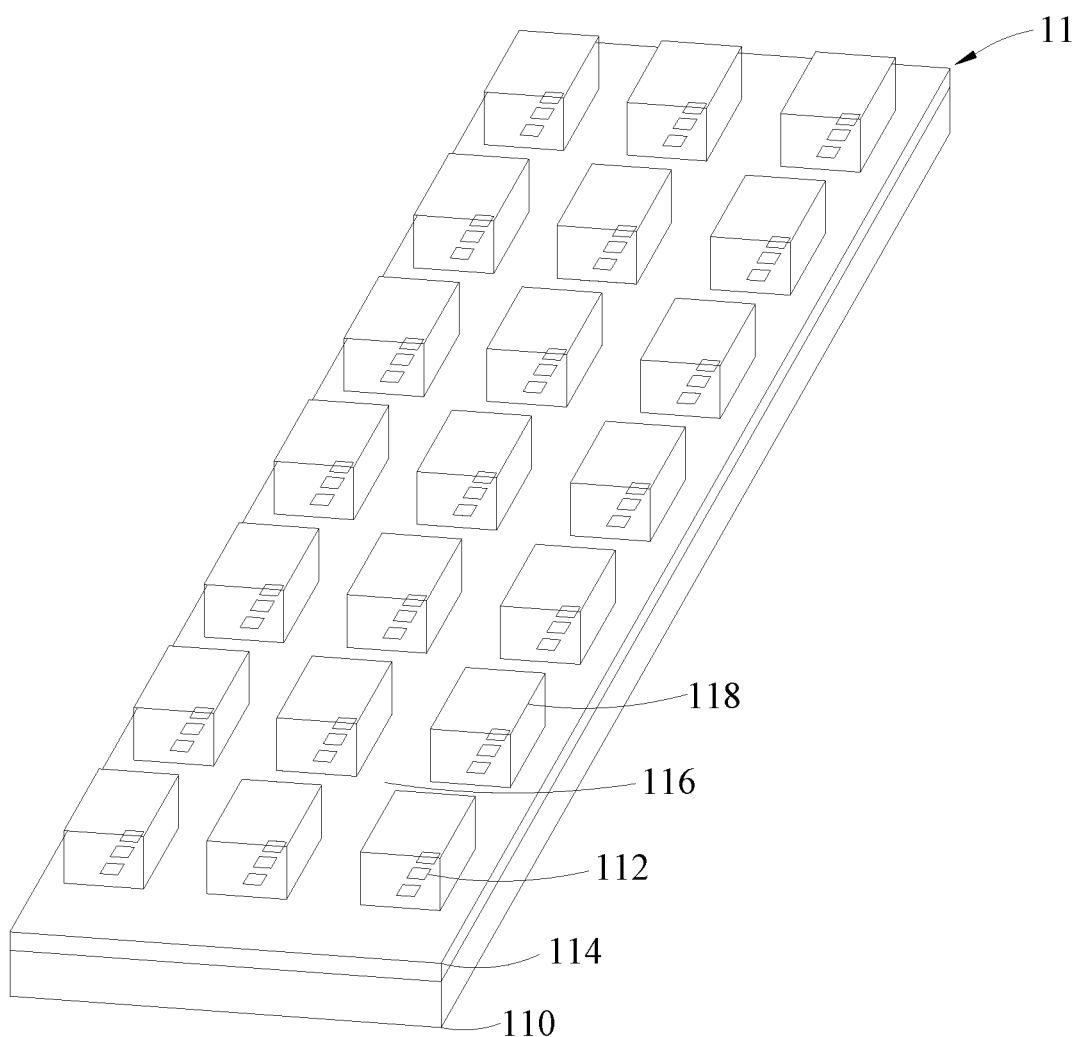
FIG. 4 is a structural view of a display unit board of the display module in FIG. 2.

In this embodiment, as shown in FIG. 4, each display unit board 11 further comprises a packaging layer 114 which covers the circuit board 110 to package the multiple pixel points, wherein the packaging layer 114 is formed with vertical and horizontal trenches 116, the trenches 116 divide the packaging layer 114 into multiple lens parts 118 which are spaced apart from one another, every two adjacent pixel points are spaced by one trench 116, and each lens part 118 corresponds to one pixel point. In other embodiments, the packaging layer 114 is formed with multiple horizontal trenches, and each horizontal trench is located between two adjacent pixel points; or, the packaging layer 114 is formed with multiple vertical trenches, and each vertical trench is located between two adjacent pixel points.

In this embodiment, each pixel point includes three LED chips 112 emitting light in different colors. Preferably, the three LED chips 112 emitting light in different colors are respectively a red-light LED chip, a blue-light LED chip and a green-light LED chip. In other embodiments, each pixel point may include four LED chips 112.

Figure 5:
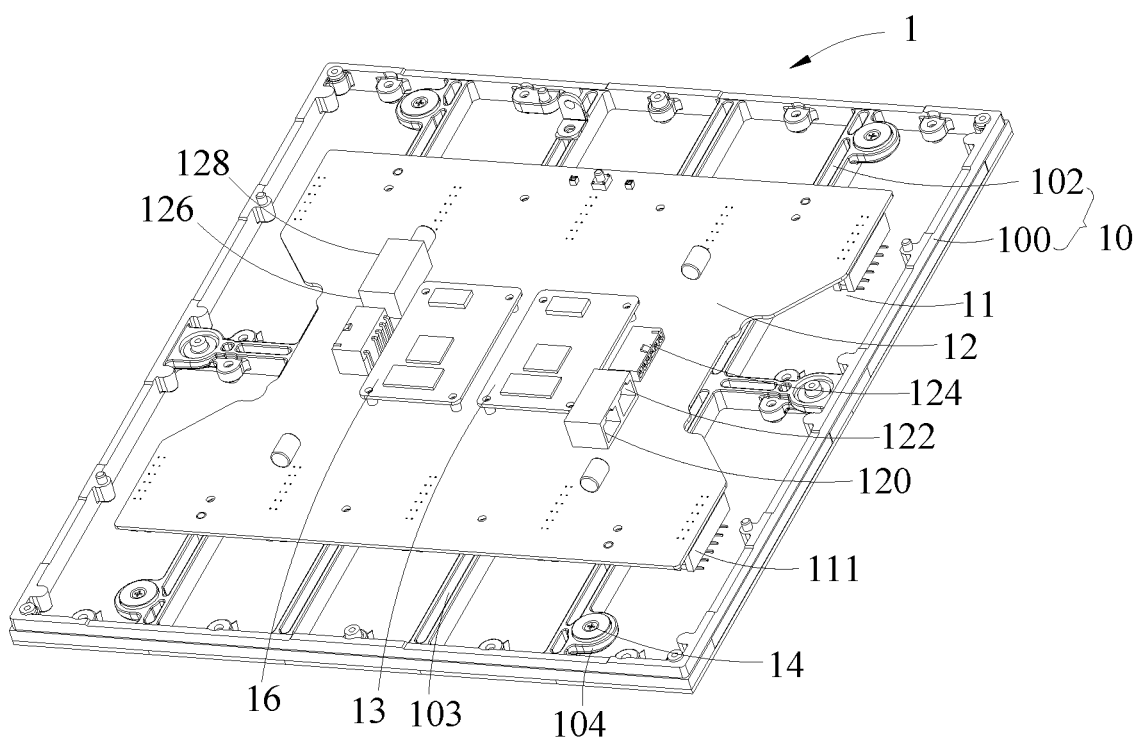
FIG. 5 is a structural view of a second embodiment of the display module of the invention.

Referring to FIG. 5 which is a structural view of a second embodiment of the display module of the invention, the display module in the second embodiment is improved as follows on the basis of the first embodiment:

The display module 1 in this embodiment further comprises a backup receiving card 16. The backup receiving card 16 is installed on a side, away from the support frame 102, of the switch board 12. Clearly, the display module 1 in this embodiment is additionally provided with the backup receiving card 16, so that when the main receiving card 13 malfunctions or cannot operate, the backup receiving card 16 can replace the main receiving card 13 to send the processed data to the multiple display unit boards 11 for display, thus realizing data backup and guaranteeing normal operation of the display module 1. Wherein, the function and installation manner of the backup receiving card 16 are identical with those of the main receiving card 13 and will not detailed anymore.

In this embodiment, the backup receiving card 16 communicates with the main receiving card 13 through the switch board 12 and monitors the operating condition of the main receiving card 13. When monitoring that the main receiving card 13 malfunctions or does not operate, the backup receiving card 16 replaces the main receiving card 13 to process data and send processed data to the display unit boards 11.

It should be noted that, in other embodiments, a data switching circuit may be disposed on the switch board 12 to switch the main receiving card 13 and the backup receiving card 16 to realize data backup. Specifically, the data switching circuit may be a single-chip microcomputer, a digital chip or other switching circuits. If the data switching circuit is a single-chip microcomputer, the single-chip microcomputer detects a plurality of signals in the main receiving card 13; when a signal error is detected or no signal is detected, the single-chip microcomputer switches the main receiving cart 13 to the backup receiving card 16 to realize the data processing function, and at this moment, the backup receiving card 16 processes data and sends processed data to the display unit boards 11. If the digital switching circuit is a digital chip, the digital chip monitors whether a digital level in the main receiving card 13 has a rising edge and a falling edge; when monitoring that the digital level in the main receiving card 13 only has the rising edge or the falling edge, the digital chip switches the main receiving card 13 to the backup receiving card 16 to realize the data processing function, and at this moment, the backup receiving card 16 processes data and sends processed data to the display unit boards 11.

In this embodiment, the switch board 12 is provided with a second input interface 126 and a second output interface 128 electrically conductive with the backup receiving card 16, wherein the second input interface 126 is used for inputting data, and the second output interface 128 is used for outputting data, that is, the second output interface 128 outputs processed data to the next display module 1. Preferably, the second input interface 126 and the second output interface 128 are both network interfaces.

In this embodiment, the switching principle of the main receiving card 13 and the backup receiving card 16 is as follows:

Data transmission and processing realized by the first input interface 120, the main receiving card 13 and the first output interface 122 are independent of data transmission and processing realized by the second input interface 126, the backup receiving card 16 and the second output interface 128, and data processed by the main receiving card 13 and the backup receiving card 16 may be from the same sending card or from different sending cards.

When operating normally, the main receiving card 13 processes data input via the first input interface 120 and sends processed data to the multiple display unit boards 11 for display, and the processed data is sent to the next adjacent display module 1 via the first output interface 122. At the same time, the backup receiving card 16 monitors the operating condition of the main receiving card 13; when monitoring that the main receiving card 13 malfunctions or does not operate, the backup receiving card 16 replaces the main receiving card 13 to process data input via the second input interface 126 and sends processed data to the multiple display unit boards 11 for display, and the processed data is sent to the next adjacent display module 1 via the second output interface 128.

Figure 6:
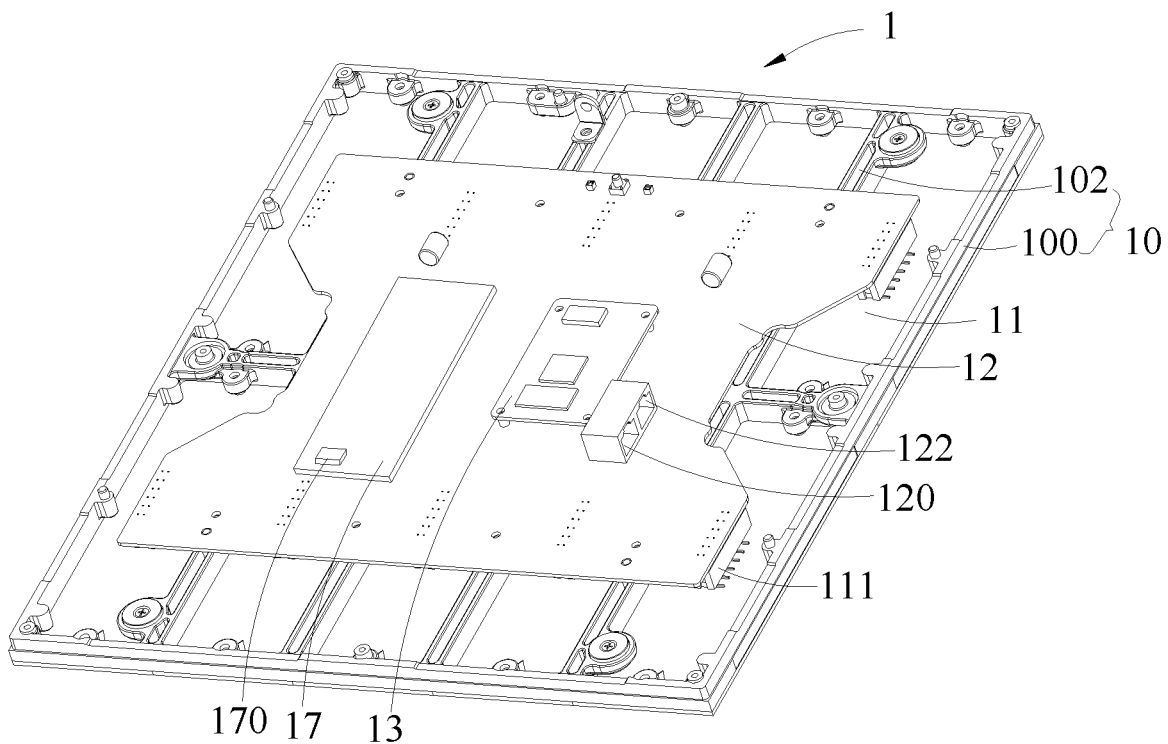
FIG. 6 is a structural view of a third embodiment of the display module of the invention.

Referring to FIG. 6 which is a structural view of a third embodiment of the display module of the invention, the third embodiment of the display module differs from the first embodiment in the following aspects:

The display module 1 further comprises a first module power supply 17, which is electrically connected to the switch board 12 and used for converting a first DC voltage into a second DC voltage, wherein the first DC voltage is greater than the second DC voltage. Because power input to the display module 1 needs to be subjected to voltage reduction by the first module power supply 17, the switch board 12 is not provided with a power interface 124, and correspondingly, the first module power supply 17 is provided with a DC power terminal 170 for inputting DC power. Preferably, 48V power input via the DC power terminal 170 is reduced to 4.5V by the first module power supply 17.

The first module power supply 17 is disposed on the display module 1 to further reduce an input DC voltage, and the reduced voltage is output to the main receiving card 13 and the multiple display unit boards 11 through the switch board 12. By adoption of dual voltage reduction, power cooling is facilitated.

In this embodiment, the first module power supply 17 is installed on the switch board 12 through connectors, that is, the first module power supply 17 is integrated on the switch board 12, so that the first module power supply 17 can be assembled and disassembled easily, and plugging and unplugging are facilitated. In other embodiments, the first module power supply 17 may be arranged separately, that is, the first module power supply 17 is not installed on the switch board 12 and is electrically connected to the switch board 12 through a cable to realize power supply.

The invention further provides a fourth embodiment of the display module. On the basis of the second embodiment and the third embodiment, the main receiving card 13, the backup receiving card 16 and the first module power supply 17 are all integrated on the switch board 12 of the display module 1 in the fourth embodiment.

The invention further provides a fifth embodiment of the display module. The fifth embodiment of the display module 1 differs from the third embodiment or the fourth embodiments in the following aspects:

The display module 1 comprises a second module power supply (not shown), wherein the second module power supply is electrically connected to the switch board 12 and replaces the first module power supply 17 in the third embodiment or the fourth embodiment to convert AC power into DC power, that is, the second module power supply converts a 220V AC voltage into a 4.5V DC voltage. Clearly, under the condition of good heat dissipation, this power supply design can decrease the number of power devices and reduce the cost.

It should be noted that the second module power supply may be installed on the switch board 12 or be electrically connected to the switch board 12 through a cable.

Figure 7:
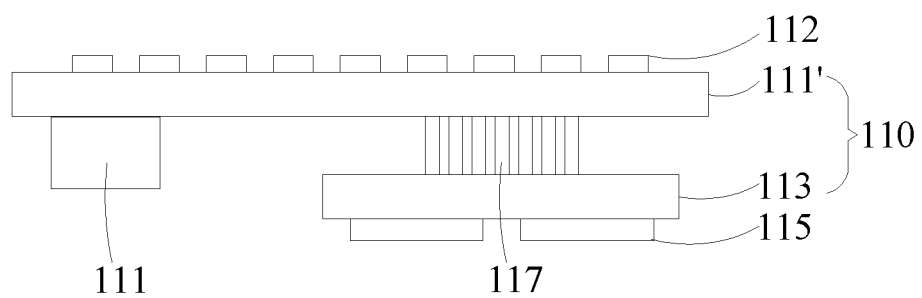
FIG. 7 is a structural view of a display unit board of a sixth embodiment of the display module of the invention.

Referring to FIG. 7 which is a structural view of the display unit board in a sixth embodiment of the display module of the invention, the sixth embodiment of the display module differs from the first, second, third, fourth and fifth embodiments in the following aspects:

The circuit board 110 is of a lamp-driver separated structure, that is, the circuit board 110 comprises a lamp panel 111' and a driver board 113 which are electrically connected through a connector 117; multiple pixel points are disposed on a side, away from the driver board 113, of the lamp panel 111', and multiple driver chips 115 are disposed on the driver board 113.

By adoption of the lamp-driver separated structure, the integration level of the circuit board 110 can be reduced, and the layout of the driver chips 115 is facilitated. Particularly, in case where LED chips 112 are integrated on the front side of the circuit board 110 at a high density, a lamp-driver integrated structure probably cannot realize dense arrangement of the driver chips 115 because of the complicated wiring of the circuit board 110 and the limited area of the back side of the circuit board 110; the lamp-driver separated structure can simplify the wiring of the driver board 113, and thus can realize dense arrangement of the driver chips 115.

In this embodiment, the lamp panel 111' is provided with a male connector, the driver board 113 is provided with a female connector, and driver board 113 is connected to the lamp panel 111' in a plugged manner; moreover, to further fix the driver board 113 on the lamp panel 111', the driver board 113 may be locked on the lamp panel 111' with screws. In other embodiments, the lamp panel 111' may be provided with a female connector, and the driver board 113 may be provided with a male connector.

In this embodiment, the area of the lamp panel 111' is greater than that of the driver board 113, and the lamp panel 111' is installed on the frame 10 and may be fixed on the frame 10 by means of bonding or screw locking. A first connector 111 is disposed on the lamp panel 111' and avoids the driver board 113, so that a second connector 126 on the switch board 12 can be connected to the first connector 111 in a plugged manner. The driver board 113 may be disposed outside the switch board 12 or disposed between the switch board 12 and the lamp panel 111'.

In this embodiment, the multiple driver chips 115 are disposed on the side, away from the lamp panel 111', of the driver board 113, thus being easy to maintain. Clearly, in other embodiments, the multiple driver chips 115 may be disposed on a side, facing the lamp panel 111', of the driver board 113, or disposed on both sides of the driver board 113.

Figure 8:
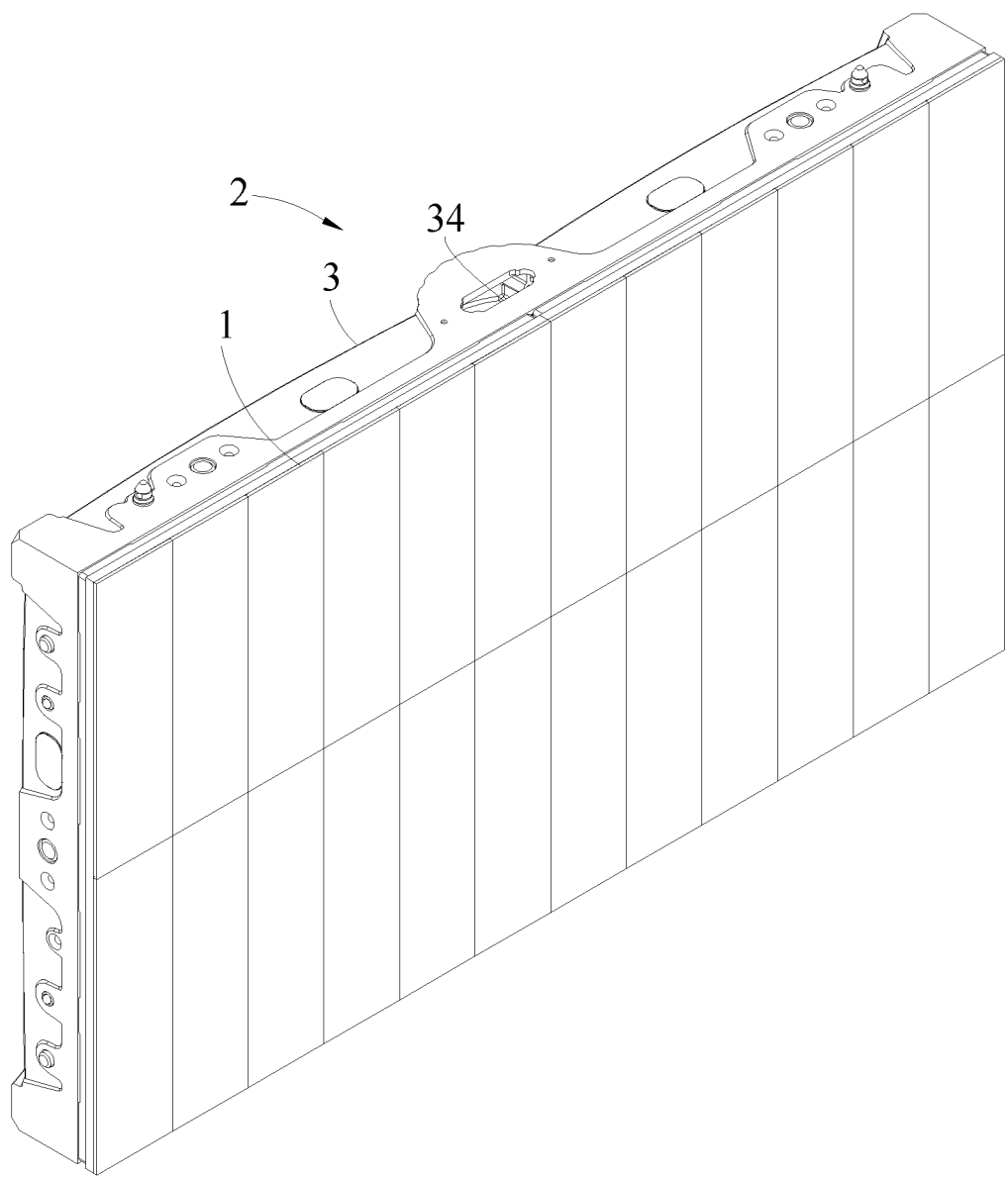
FIG. 8 is a structural view of a first embodiment of a display screen of the invention.
Figure 9:
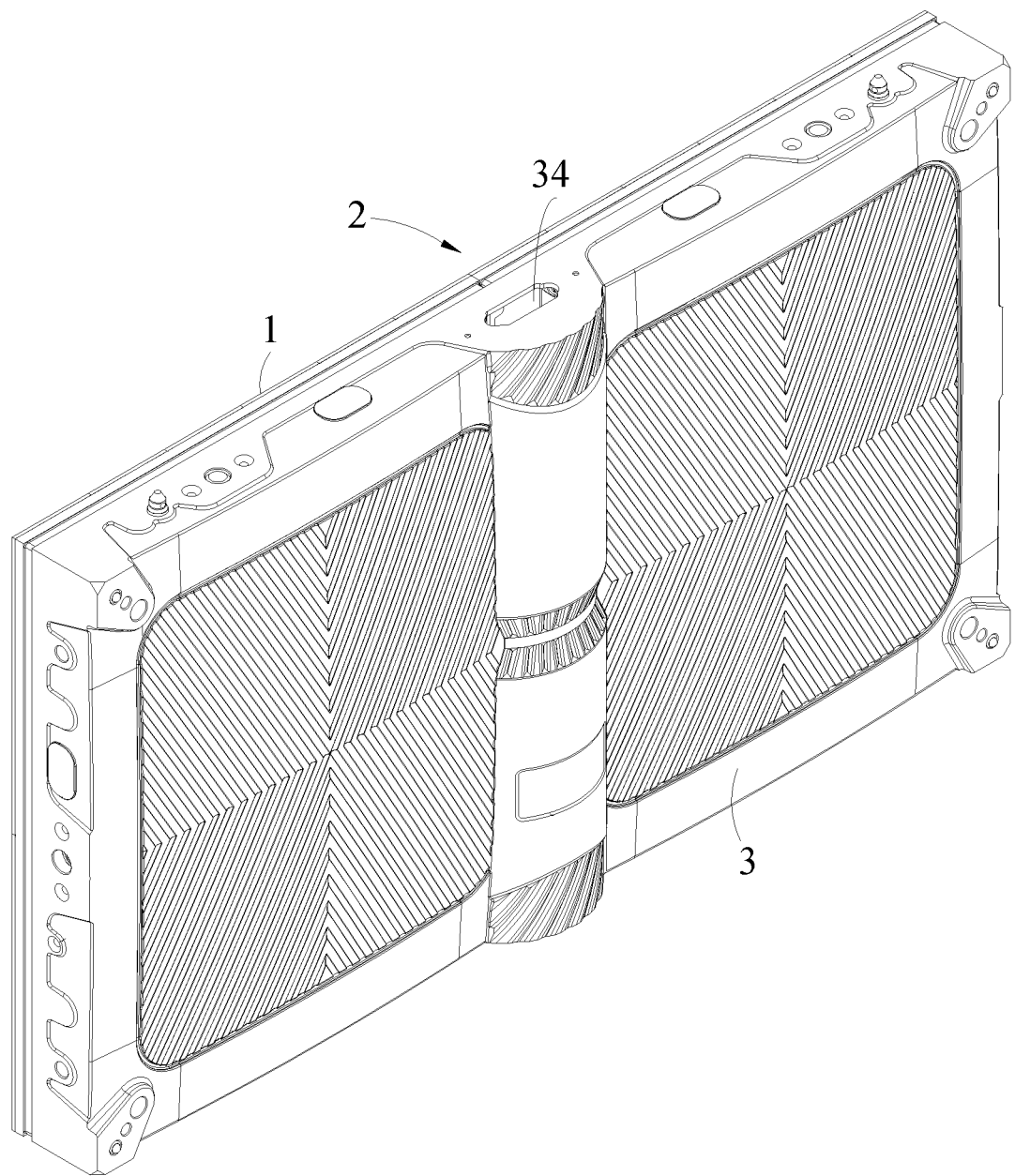
FIG. 9 is a structural view of the display screen in FIG. 8 from another perspective.
Figure 10:
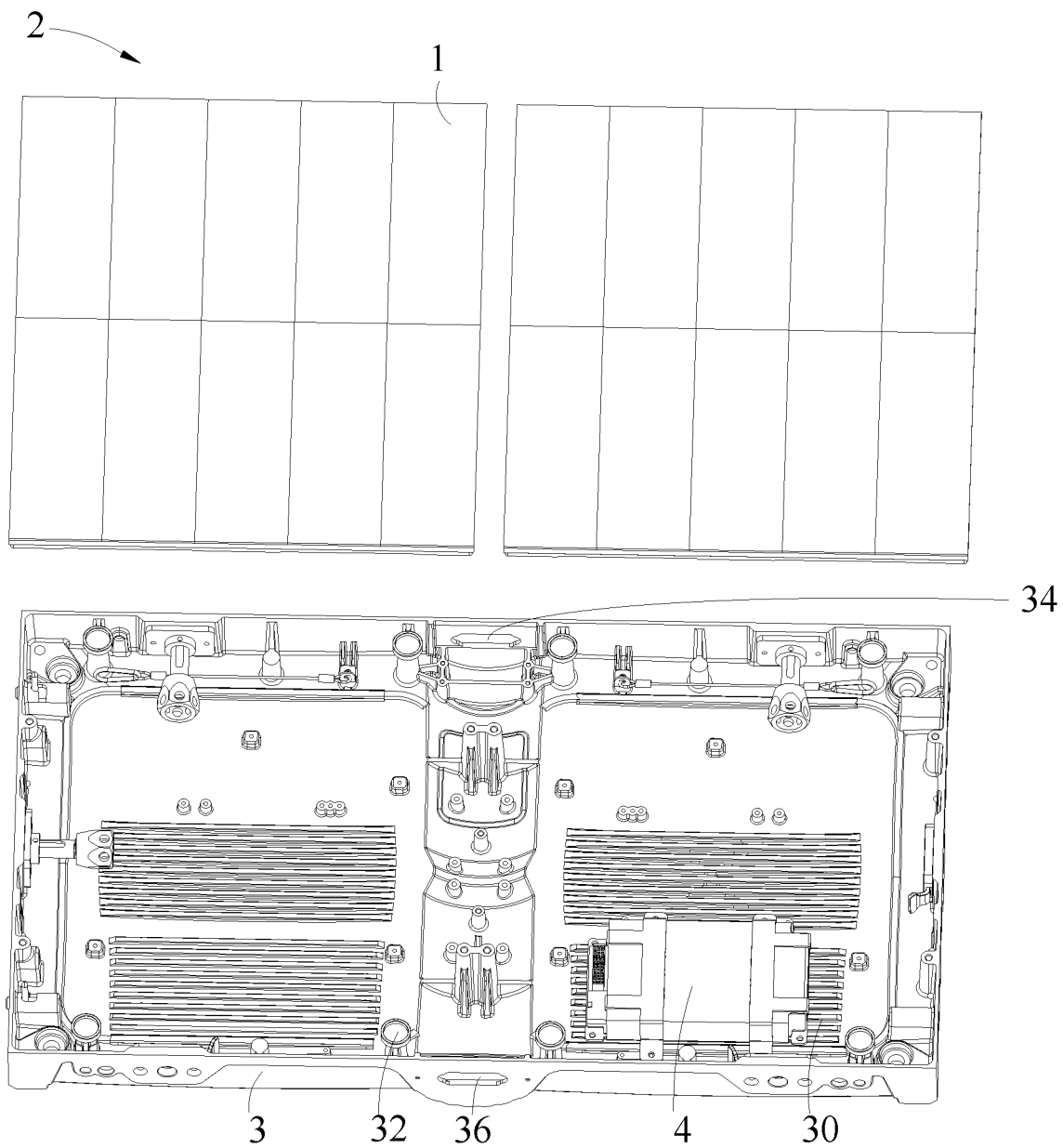
FIG. 10 is an exploded view of the display screen in FIG. 9.

The invention further provides a display screen. Referring to FIG. 8 to FIG. 10, in a first embodiment, the display screen 2 comprises a bottom case 3 and display modules 1 installed in the bottom case 3, wherein the specific structure of the display modules 1 can be understood with reference to the first, second, third and fourth embodiments mentioned above. Because the display screen 2 in this embodiment adopts all technical solutions of the first, second, third and fourth embodiments of the display module 1 mentioned above, it has all the beneficial effects fulfilled by these technical solutions, and details will not be given anymore. It should be noted that in this invention, the number of the display modules 1 can be set as actually needed, and may be, but not limited to, 1, 2, 4 or more. In this embodiment, the number of the display modules 1 is preferably two, and the two display modules 1 are assembled to form a display surface to be installed in the bottom case 3.

In this embodiment, the display screen 2 further comprises a first power unit 4 disposed between the bottom case 3 and the display modules 1, electrically connected to all the display modules 1, and used for converting AC power into DC power to realize power supply. After converting AC power into DC power, the first power unit 4 directly outputs the DC power to each display module 1 to supply power to each display module 1.

In case where each display module 1 is not provided with a power supply, the first power unit 4 converts 220V AC power into 4.5V DC power and outputs the 4.5V DC power to the power interfaces 124. In case where each display module 1 is provided with the first module power supply 17, the first power unit 4 converts 220V AC power into 48V DC power and outputs the 48V DC power to the DC power terminals 170.

In this embodiment, at least one set of protruding ribs 30 is disposed on an inner surface of the bottom case 3, and the first power unit 4 is installed on one set of protruding ribs 30. The first power unit 4 is installed on one set of protruding ribs 30, so that cooling of the first power unit 4 is facilitated.

In this embodiment, the bottom case 3 is made of metal. Preferably, the bottom case 3 is made of die-cast aluminum. The bottom case 3 made of metal is beneficial to cooling of the first power unit 4 and the display modules 1. The bottom case 3 may also be made of other metals, such as iron.

In this embodiment, a first through hole 34 is formed in one side of the bottom case 3, a second through hole 36 is formed in the other side of the bottom case 3, and the first through hole 34 is opposite to the second through hole 36. The display screen 2 further comprises a first assembly connector (not shown) and a second assembly connector (not shown) which are used for data and power transmission, wherein the first assembly connector is installed in the bottom case 3 and can realize connection through the first through hole 34, and the second assembly connector is installed in the bottom case 3 and can realize connection through the second through hole 36. The first assembly connector of one display screen 2 is connected to the second assembly connector of another adjacent display screen 2 in a plugged manner.

When multiple display screens 2 are assembled, one side of one display screen 2 is assembled with the other side of another display assembly 2, the first assembly connector of one display screen 2 is connected to the second assembly connector of another adjacent display screen 2 in a plugged manner, the display screens are electrically connected (data and power) in the assembly process, and connection through cables after assembly is not needed anymore.

Preferably, in this embodiment, the first assembly connector is a male connector and penetrates through the first through hole 34, and the second assembly connector is a female connector. In other embodiments, the first assembly connector may be a female connector, and the second assembly connector may be a male connector. In addition, in this embodiment, the first assembly connector is located on an upper side of the bottom case 3, and the second assembly connector is located on a lower side of the bottom case 3. In other embodiments, the first assembly connector may be located on a left side of the bottom case 3, and the second assembly connector may be located on a right side of the bottom case 3.

In this embodiment, multiple magnetic assemblies 32 are disposed on the bottom case 3, each magnetic assembly 32 corresponds to one magnet assembly 14 on one display module 1, and the four magnet assemblies 14 on each display module 1 are attracted to four magnetic assemblies 32 on the bottom case 3, so that the display modules 1 are installed in the bottom case 3, and pre-maintenance of the display modules 1 is realized. The magnetic assemblies 32 include magnets.

Figure 11:
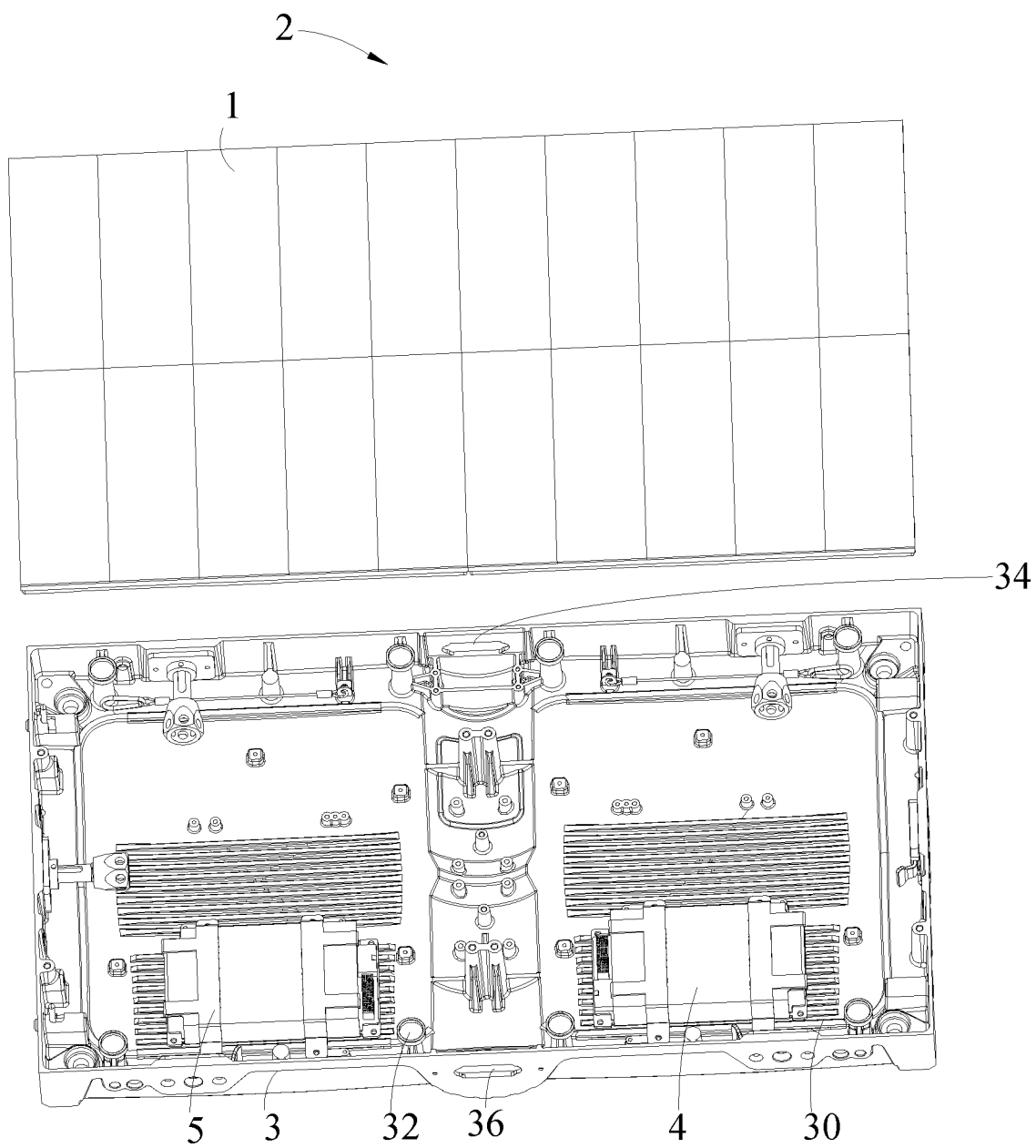
FIG. 11 is a structural view of a second embodiment of the display screen of the invention.
Figure 12:
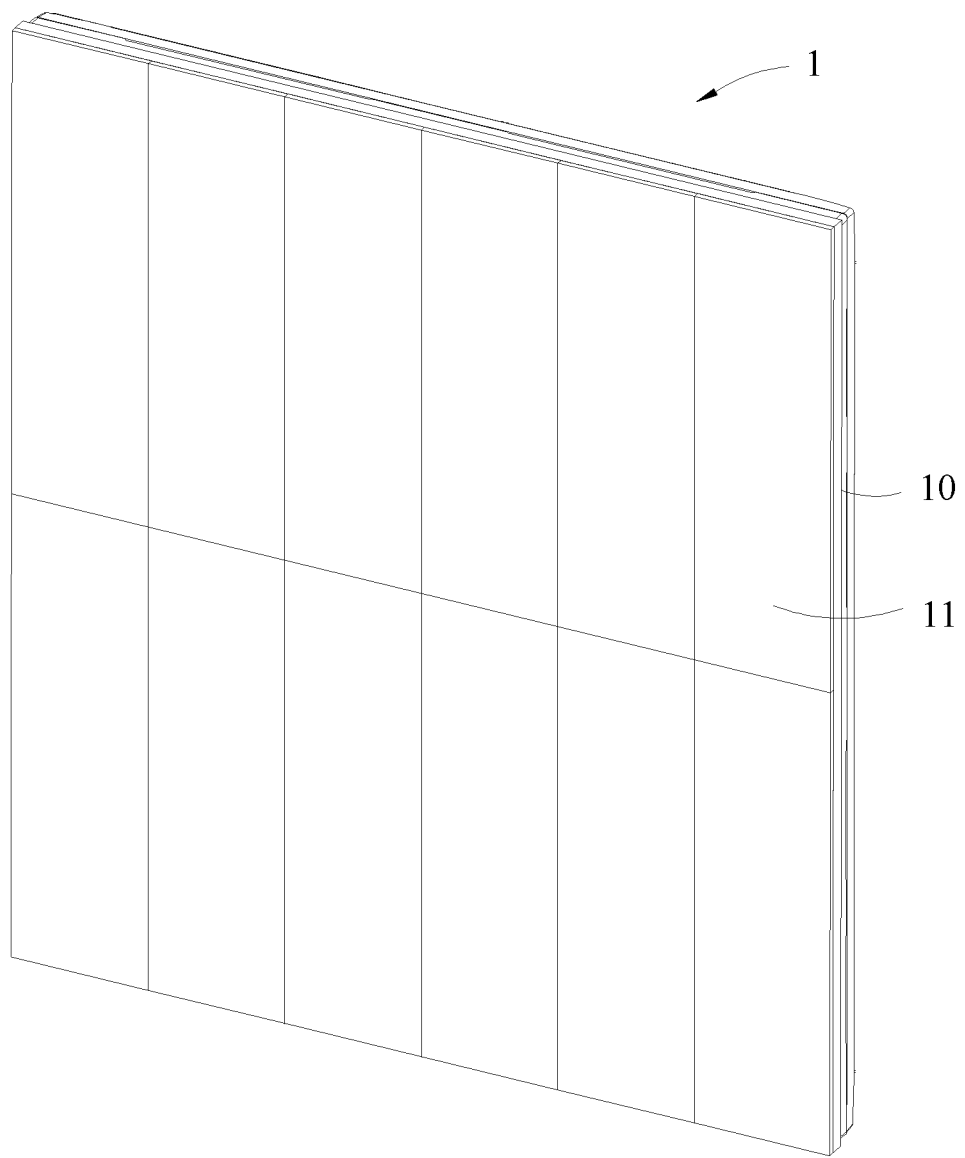
FIG. 12 is a structural view of a seventh embodiment of the display module of the invention.
Figure 13:
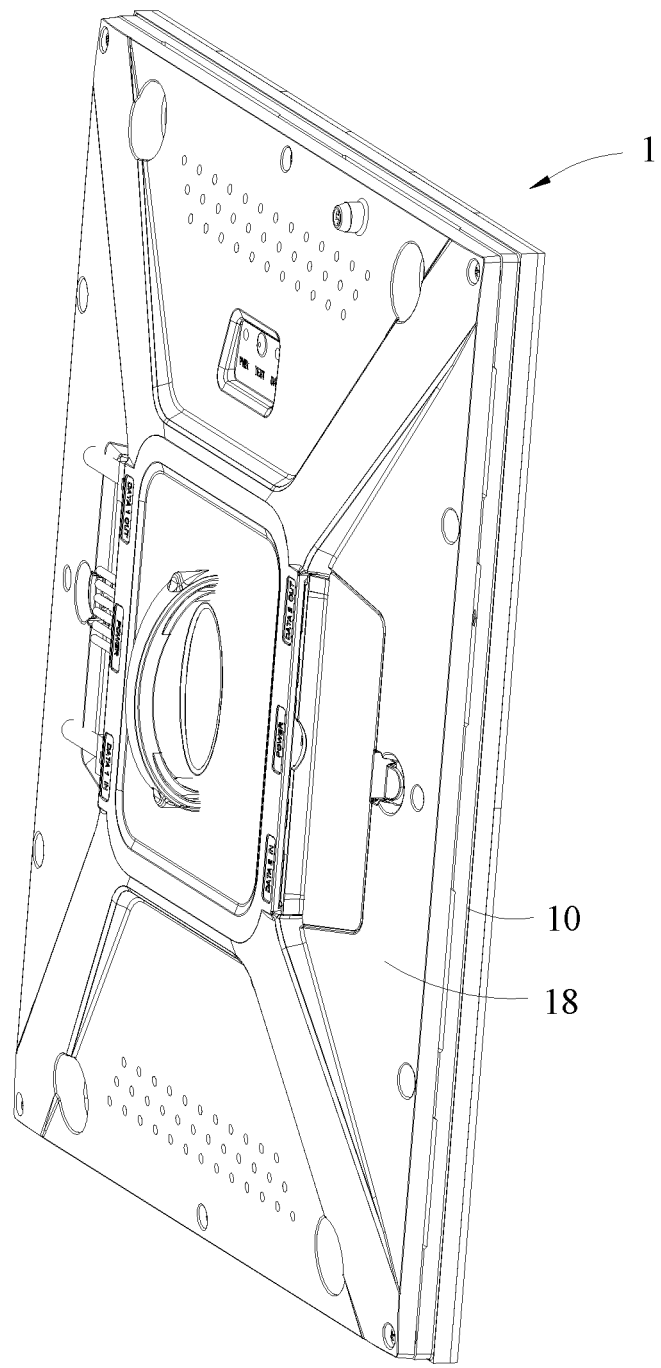
FIG. 13 is a structural view of the display module in FIG. 12 from another perspective.
Figure 14:
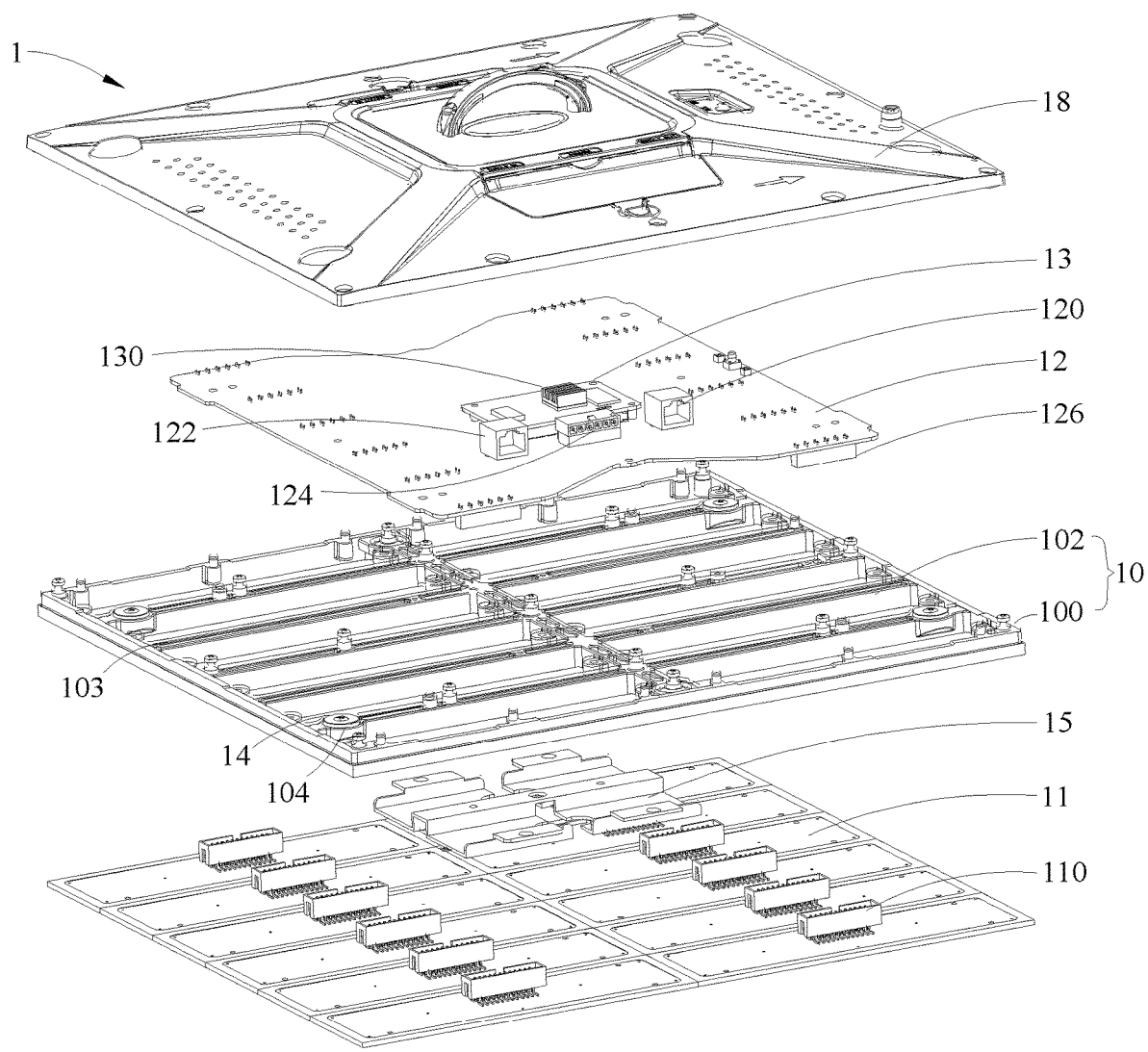
FIG. 14 is an exploded view of the display module in FIG. 13.

Referring to FIG. 11 which is a structural view of a second embodiment of the display screen of the invention, the display screen in the second embodiment is improved in the following aspects on the basis of the first embodiment:

The display screen 2 further comprises a second power unit 5. The second power unit 5 is disposed between the bottom case 3 and the display modules 1, electrically connected to all the display modules 1, and used for converting AC power into DC power to realize power supply.

In this embodiment, the display screen 2 is additionally provided with the second power unit 5, which means that the first power unit 4 and the second power unit 5 supply power to the display modules 1 at the same time, so that when the first power unit 4 or the second power unit 5 cannot operate, the other normal power unit can still supply power to the display modules to guarantee normal operation of the display screen 2. For example, in case where the operating current of one display module 1 is 30 A, the first power unit 4 and the second power unit 5 supply power to the display module 1 synchronously and each provide a 15 A current; when the first power unit 4 cannot operate, the second power unit 5 separately provides a 30 A current for the display module 1 to guarantee normal operation of the display module 1.

The invention further provides a third embodiment of the display screen. This embodiment of the display screen differs from the first embodiment or the second embodiment in the following aspects:

No power supply is disposed between the display modules 1 and the bottom case 3, and each display module 1 is directly connected to a power supply outside the display screen 2. In case where the display modules 1 in the third embodiment or the fourth embodiment are adopted, a 48V DC voltage is directly input from the outside of the display screen 2, such as from a distribution box. In case where the display modules 1 in the fifth embodiment are adopted, a 220V AC voltage is directly input from the outside of the display screen, that is, each display module 1 is directly accessed to a mains supply.

The invention further provides a fourth embodiment of the display screen. This embodiment of the display screen differs from all the above-mentioned embodiments in the following aspects:

Each display module 1 of the display screen 2 in this embodiment is the display module 1 in the sixth embodiment, that is, the display unit boards 11 of the display module 11 are of a lamp-driver separated structure instead of a lamp-driver integrated structure in other embodiments.

The invention provides a display module. Referring to FIG. 12 to FIG. 15, in a seventh embodiment, the display module 1 comprises a frame 10, multiple display unit boards 11 and a back cover 18, wherein the multiple display unit boards 11 are assembled and installed on the frame 10 to form a display surface, and the frame 10 is installed on the back cover 18. The frame 10 comprises a border 100 and a support frame 102 installed in the border 100. Each display unit board 11 comprises a circuit board 110 and multiple pixel points installed on a front side of the circuit board 110, wherein a back side of the circuit board 110 is installed on the border 100 and the support frame 102, and each pixel point includes at least one LED chip 112.

According to the display module 1 in this embodiment, the multiple display unit boards 11 are assembled on the frame 10 to form the display surface and are installed on the border 100 and the support frame 102 of the frame 10, so that assembly is easy, the process is simple and reliable, the assembly uniformity is guaranteed, and seams between the display unit boards 11 are reduced.

It should be noted that the back sides of the circuit boards of the invention may be installed on the frame 10 by means of screw connection or bonding. For example, copper pillars may be welded on the back sides of the circuit boards 110, and the frame 10 and the copper pillars are connected with screws. The support frame is of a criss-cross structure, an obliquely crossed structure or other structures, is used for supporting and carrying the back sides of the circuit boards 110, and coordinates with the border 100 to assemble and install the multiple display unit boards 11. Clearly, components on the back sides of the circuit boards 110 should avoid the support frame 102.

In this embodiment, the display module 1 further comprises a switch board 12 and a main receiving card 13 disposed between the frame 10 and the back cover 18, wherein the switch board 12 is installed on a side, away from the display unit boards 11, of the support frame 102 and is electrically connected to the multiple display unit boards 11, and the main receiving card 13 is installed on a side, away from the support frame 102, of the switch board 12.

The main receiving card 13 is installed on and electrically connected to the switch board 12, receives and processes data, and then transmits processed data to each display unit board 11 to realize data display. Wherein, the main receiving card 13 is a receiving card and may also be called a receiving control card or a control card, and the switch board 12 is also called a Hub board.

In this embodiment, the main receiving card 13 is installed on the switch board 12 in a plugged manner through connectors, and thus can be easily assembled and disassembled and be quickly plugged and unplugged. Moreover, to further fix the main receiving card 13 on the switch board 12, the main receiving board 13 is locked on the switch board 12 with screws. Preferably, the main receiving card 13 is provided with two rows of female connectors, the switch board 12 is provided with two rows of male connectors, and the female connectors of the main receiving card 13 are plugged and matched with the male connectors of the switch board 12. In other embodiments, the main receiving card 13 may be connected to the switch board 12 through a cable.

In this embodiment, the switch board 12 is provided with a first input interface 120 and a first output interface 122 electrically conductive with the main receiving card 13. The first input interface 120 is used for inputting data, the main receiving card 13 receives and processes the input data, and processed data is displayed by the display surface formed by the multiple display unit boards 11. The first output interface 122 is used for outputting the processed data to the next display module 1. Preferably, the first input interface 120 and the first output interface 122 are both network interfaces.

In this embodiment, first cooling fins 130 are disposed on a master chip of the main receiving card 13 and can cool the master chip, thus improving the stability of the master chip and prolonging the service life of the master chip.

In this embodiment, the switch board 12 is provided with a power interface 124 for inputting power, and DC power is input via the power interface 124 to be supplied to the whole display module 1. Specifically, a 4.5V DC voltage is input via the power interface 124 to supply power to each display unit board 11 through the switch board 12. It should be noted that the input DC voltage can be regulated as actually needed and is not limited to 4.5V.

In this embodiment, a first connector 111 is disposed on the back side of the circuit board 110 of each display unit board 11, multiple second connectors 126 are disposed on the switch board 12, and each first connector 111 is connected to one second connector 126 in a plugged manner, so that the switch board 12 transmits data and power to each display unit board 11 through the second connectors 126 and the first connectors 111 to realize the display function of the display module 1. Preferably, the first connectors 111 are male connectors, and the second connectors 126 are female connectors. In other embodiments, the first connectors 111 may be female connectors, and the second connectors 126 may be male connectors. In addition, the switch board 12 is fixed on the support frame 102 with screws to prevent the first connectors 111 from disengaging from the second connectors 126 under vibrations in the transport process, so that data and power transmission will not be affected.

In this embodiment, the support frame 102 is of the criss-cross structure and coordinates with the border 100 to form multiple installation frames, and the periphery of the circuit board 110 of each display unit board 11 is bonded to one installation frame.

Compared with the manner of installing the display unit boards 11 with screws, the manner of installing the display unit boards 11 by bonding is simple, quick and efficient. In addition, the peripheries of the circuit boards 110 are bonded to the installation frames, so that the edges of the circuit boards 110 can be fully used, the clearance on the back sides of the circuit boards 110 is reduced, and the configuration of components on the back sides of the circuit boards 110 is facilitated. Clearly, every two adjacent display unit boards 11 share one part of the support frame 102.

Preferably, in this embodiment, the support frame 102 comprises a first beam (not marked) and n second beams (not marked), wherein the first beam is perpendicularly connected with the midpoints of two opposite edges of the border 100 and the midpoints of all the second beams, and each second beam is perpendicularly connected with two opposite edges of the border 100. Wherein, n may be, but not limited to, 3, 4, 5 or 6, and correspondingly, the number of the display unit boards 11 may be, but not limited to, 8, 10, 12 or 14. Clearly, all display unit boards 11 are supported on the border 100, the first beam and the second beams.

In this embodiment, to reduce raw material consumption, the weight of the support frame 102 and the cost, grooves 103 are formed in sides, away from the display unit boards 11, of the support frame 102, that is, the grooves 103 are formed in one side of the first beam and in one side of each second beam. Moreover, to guarantee the strength of the support frame 102, the grooves 103 do not extend to joints of the first beam and the second beams.

In this embodiment, the display module 1 further comprises an iron sheet 15, which is disposed between the support frame 102 and the switch board 12 and allows a pre-maintenance tool to be magnetically attracted thereto, and the pre-maintenance tool can be magnetically attracted to the iron sheet 15 to realize pre-maintenance of the display module 1.

In this embodiment, the display module 1 further comprises multiple magnet assemblies 14. Multiple installation grooves 104 are formed in the side, away from the display unit boards 11, of the support frame 102, are close to different corners of the border 100 and are not communicated with the grooves 103. Each magnet assembly 14 is separably installed in one installation groove 104. The display module 1 can be magnetically installed on a bottom case 3 or a box through the magnet assemblies 14, so that assembly and disassembly are facilitated, and pre-maintenance of the display module 1 is realized.

Preferably, in this embodiment, the installation grooves 104 are close to different corners of the border 100, are not communicated with the grooves 103 and are formed in the two outermost second beams of the support frame 102. Each magnet assembly 14 comprises a magnet and a screw penetrating through the magnets to fix the magnet in one installation groove 104. The number of the installation grooves 104 and the number of the magnet assemblies 14 are four.

Figure 15:
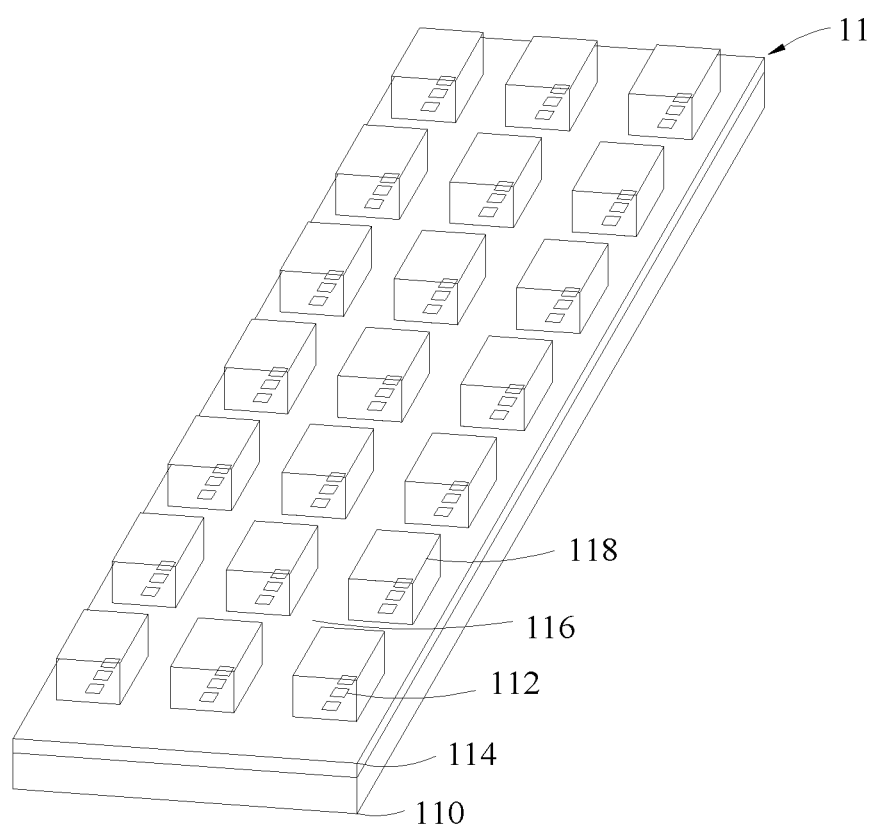
FIG. 15 is a structural view of a display unit board of the display module in FIG. 13.

In this embodiment, as shown in FIG. 15, each display unit board 11 further comprises a packaging layer 114 which covers the circuit board 110 to package the multiple pixel points, wherein the packaging layer 114 is formed with vertical and horizontal trenches 116, the trenches 116 divide the packaging layer 114 into multiple lens parts 118 which are spaced apart from one another, every two adjacent pixel points are spaced by one trench 116, and each lens part 118 corresponds to one pixel point. In other embodiments, the packaging layer 114 is formed with multiple horizontal trenches, and each horizontal trench is located between two adjacent pixel points; or, the packaging layer 114 is formed with multiple vertical trenches, and each vertical trench is located between two adjacent pixel points.

In this embodiment, each pixel point includes three LED chips 112 emitting light in different colors. Preferably, the three LED chips 112 emitting light in different colors are respectively a red-light LED chip, a blue-light LED chip and a green-light LED chip. In other embodiments, each pixel point may include four LED chips 112.

Figure 16:
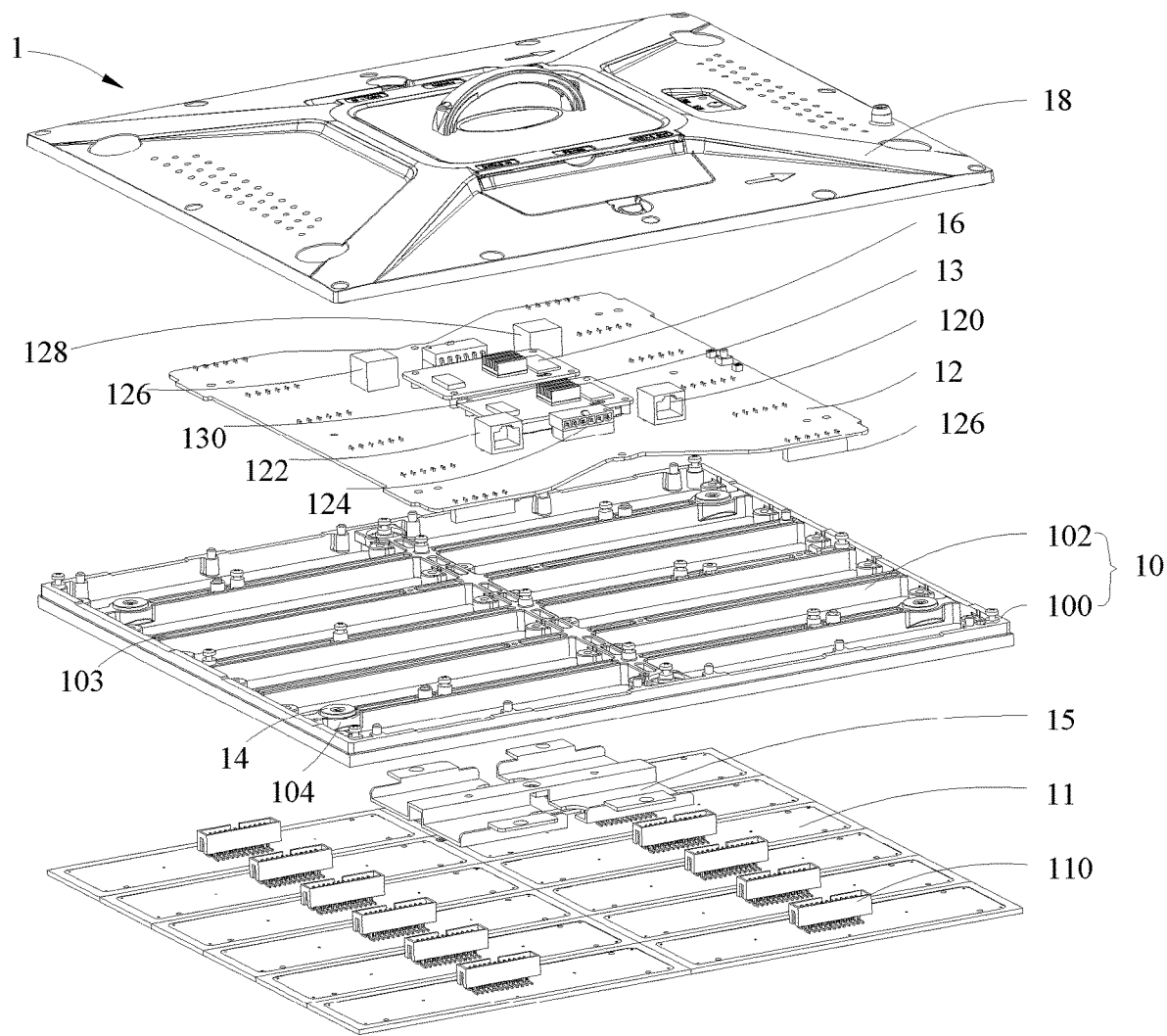
FIG. 16 is a structural view of an eighth embodiment of the display module of the invention.

Referring to FIG. 16 which is a structural view of an eighth embodiment of the display module of the invention, the display module in the eighth embodiment is improved as follows on the basis of the seventh embodiment:

The display module 1 in this embodiment further comprises a backup receiving card 16. The backup receiving card 16 is installed on a side, away from the support frame 102, of the switch board 12. Clearly, the display module 1 in this embodiment is additionally provided with the backup receiving card 16, so that when the main receiving card 13 malfunctions or cannot operate, the backup receiving card 16 can replace the main receiving card 13 to send processed data to the multiple display unit boards 11 for display, thus realizing data backup and guaranteeing normal operation of the display module 1. Wherein, the function and installation manner of the back receiving card 16 are identical with those of the main receiving card 13, and will not be detailed anymore.

In this embodiment, the backup receiving card 16 communicates with the main receiving card 13 through the switch board 12 and monitors the operating condition of the main receiving card 13. When monitoring that the main receiving card 13 malfunctions or does not operate, the backup receiving card 16 replaces the main receiving card 13 to process data and send processed data to the display unit boards 11.

It should be noted that, in other embodiments, a data switching circuit may be disposed on the switch board 12 to switch the main receiving card 13 and the backup receiving card 16 to realize data backup. Specifically, the data switching circuit may be a single-chip microcomputer, a digital chip or other switching circuits. If the data switching circuit is a single-chip microcomputer, the single-chip microcomputer detects a plurality of signals in the main receiving card 13; when a signal error is detected or no signal is detected, the single-chip microcomputer switches the main receiving cart 13 to the backup receiving card 16 to realize the data processing function, and at this moment, the backup receiving card 16 processes data and sends processed data to the display unit boards 11. If the digital switching circuit is a digital chip, the digital chip monitors whether a digital level in the main receiving card 13 has a rising edge and a falling edge; when monitoring that the digital level in the main receiving card 13 only has the rising edge or the falling edge, the digital chip switches the main receiving card 13 to the backup receiving card 16 to realize the data processing function, and at this moment, the backup receiving card 16 processes data and sends processed data to the display unit boards 11.

In this embodiment, the switch board 12 is provided with a second input interface 126 and a second output interface 128 electrically conductive with the backup receiving card 16, wherein the second input interface 126 is used for inputting data, and the second output interface 128 is used for outputting data, that is, the second output interface 128 outputs processed data to the next display module 1. Preferably, the second input interface 126 and the second output interface 128 are both network interfaces.

In this embodiment, the switching principle of the main receiving card 13 and the backup receiving card 16 is as follows:

Data transmission and processing realized by the first input interface 120, the main receiving card 13 and the first output interface 122 are independent of data transmission and processing realized by the second input interface 126, the backup receiving card 16 and the second output interface 128, and data processed by the main receiving card 13 and the backup receiving card 16 may be from the same sending card or from different sending cards.

When operating normally, the main receiving card 13 processes data input via the first input interface 120 and sends processed data to the multiple display unit boards 11 for display, and the processed data is sent to the next adjacent display module 1 via the first output interface 122. At the same time, the backup receiving card 16 monitors the operating condition of the main receiving card 13; when monitoring that the main receiving card 13 malfunctions or does not operate, the backup receiving card 16 replaces the main receiving card 13 to process data input via the second input interface 126 and sends processed data to the multiple display unit boards 11 for display, and the processed data is sent to the next adjacent display module 1 via the second output interface 128.

Figure 17:
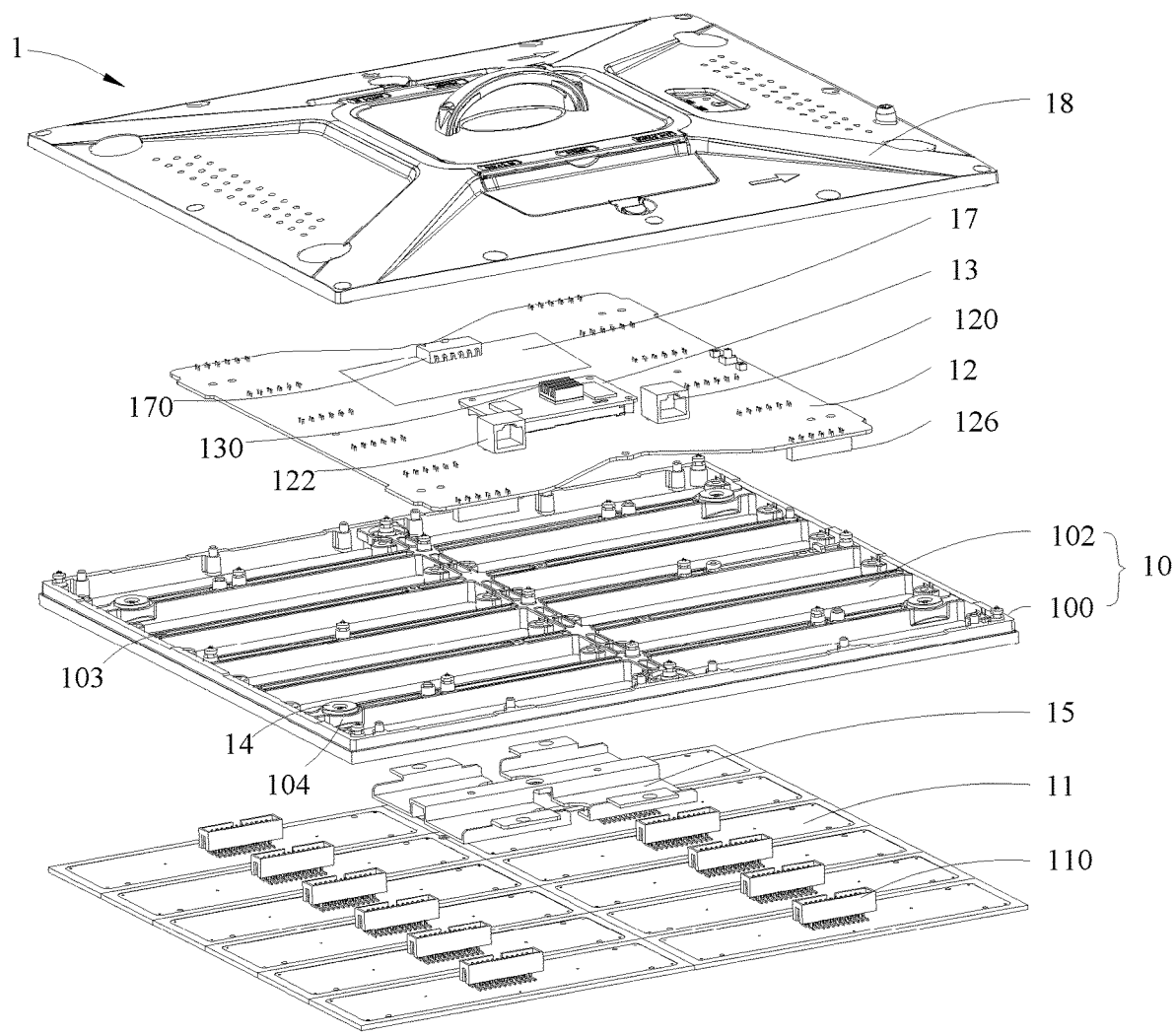
FIG. 17 is a structural view of a ninth embodiment of the display module of the invention.

Referring to FIG. 17 which is a structural view of a ninth embodiment of the display module of the invention, the ninth embodiment of the display module differs from the seventh embodiment in the following aspects:

The display module 1 further comprises a first module power supply 17, which is electrically connected to the switch board 12 and used for converting a first DC voltage into a second DC voltage, wherein the first DC voltage is greater than the second DC voltage. Because power input to the display module 1 needs to be subjected to voltage reduction by the first module power supply 17, the switch board 12 is not provided with a power interface 124, and correspondingly, the first module power supply 17 is provided with a DC power terminal 170 for inputting DC power. Preferably, 48V power input via the DC power terminal 170 is reduced to 4.5V by the first module power supply 17.

The first module power supply 17 is disposed on the display module 1 to further reduce an input DC voltage, and the reduced voltage is output to the main receiving card 13 and the multiple display unit boards 11 through the switch board 12. By adoption of dual voltage reduction, power cooling is facilitated.

In this embodiment, the first module power supply 17 is installed on the switch board 12 through connectors, that is, the first module power supply 17 is integrated on the switch board 12, so that the first module power supply 17 can be assembled and disassembled easily, and plugging and unplugging are facilitated. In other embodiments, the first module power supply 17 may be arranged separately, that is, the first module power supply 17 is not installed on the switch board 12 and is electrically connected to the switch board 12 through a cable to realize power supply.

The invention further provides a tenth embodiment of the display module. On the basis of the eighth embodiment and the ninth embodiment, the main receiving card 13, the backup receiving card 16 and the first module power supply 17 are all integrated on the switch board 12 of the display module 1 in the fourth embodiment.

The invention further provides an eleventh embodiment of the display module. The eleventh embodiment of the display module 1 differs from the ninth embodiment or the tenth embodiments in the following aspects:

The display module 1 comprises a second module power supply (not shown), wherein the second module power supply is electrically connected to the switch board 12 and replaces the first module power supply 17 in the third embodiment or the fourth embodiment to convert AC power into DC power, that is, the second module power supply converts a 220V AC voltage into a 4.5V DC voltage. Clearly, under the condition of good heat dissipation, this power supply design can decrease the number of power devices and reduce the cost.

It should be noted that the second module power supply may be installed on the switch board 12 or be electrically connected to the switch board 12 through a cable.

Figure 18:
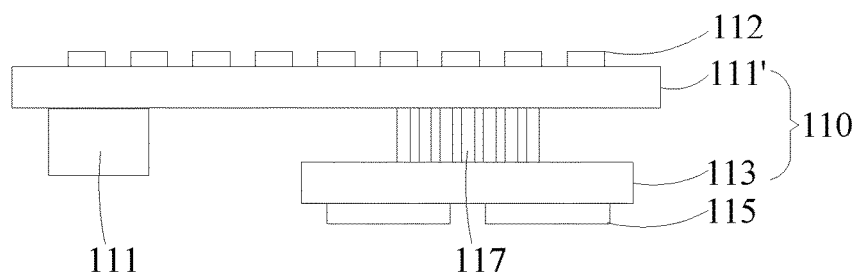
FIG. 18 is a structural view of a display unit board of a twelfth embodiment of the display module of the invention.

Referring to FIG. 18 which is a structural view of the display unit board in a twelfth embodiment of the display module of the invention, the twelfth embodiment of the display module differs from the seventh, eighth, ninth, tenth and eleventh embodiments in the following aspects:

The circuit board 110 is of a lamp-driver separated structure, that is, the circuit board 110 comprises a lamp panel 111' and a driver board 113 which are electrically connected through a connector 117; multiple pixel points are disposed on a side, away from the driver board 113, of the lamp panel 111', and multiple driver chips 115 are disposed on the driver board 113.

By adoption of the lamp-driver separated structure, the integration level of the circuit board 110 can be reduced, and the layout of the driver chips 115 is facilitated. Particularly, in case where LED chips 112 are integrated on the front side of the circuit board 110 at a high density, a lamp-driver integrated structure probably cannot realize dense arrangement of the driver chips 115 because of the complicated wiring of the circuit board 110 and the limited area of the back side of the circuit board 110; the lamp-driver separated structure can simplify the wiring of the driver board 113, and thus can realize dense arrangement of the driver chips 115.

In this embodiment, the lamp panel 111' is provided with a male connector, the driver board 113 is provided with a female connector, and driver board 113 is connected to the lamp panel 111' in a plugged manner; moreover, to further fix the driver board 113 on the lamp panel 111', the driver board 113 may be locked on the lamp panel 111' with screws. In other embodiments, the lamp panel 111' may be provided with a female connector, and the driver board 113 may be provided with a male connector.

In this embodiment, the area of the lamp panel 111' is greater than that of the driver board 113, and the lamp panel 111' is installed on the frame 10 and may be fixed on the frame 10 by means of bonding or screw locking. A first connector 111 is disposed on the lamp panel 111' and avoids the driver board 113, so that a second connector 126 on the switch board 12 can be connected to the first connector 111 in a plugged manner. The driver board 113 may be disposed outside the switch board 12 or disposed between the switch board 12 and the lamp panel 111'.

In this embodiment, the multiple driver chips 115 are disposed on the side, away from the lamp panel 111', of the driver board 113, thus being easy to maintain. Clearly, in other embodiments, the multiple driver chips 115 may be disposed on a side, facing the lamp panel 111', of the driver board 113, or disposed on both sides of the driver board 113.

The invention further provides a display screen. Referring to FIG. 19 to FIG. 23, in a fifth embodiment, the display screen 2 comprises a box 3' and display modules 1 installed in the box 3', wherein the specific structure of the display modules 1 can be understood with reference to the seventh, eighth, ninth and tenth embodiments mentioned above. Because the display screen 2 in this embodiment adopts all technical solutions of the seventh, eighth, ninth and tenth embodiments of the display module 1 mentioned above, it has all the beneficial effects fulfilled by these technical solutions, and details will not be given anymore. It should be noted that in this invention, the number of the display modules 1 can be set as actually needed, and may be, but not limited to, 1, 2, 4 or more. In this embodiment, the number of the display modules 1 is preferably two, and the two display modules 1 are assembled to form a display surface to be installed in the box 3'.

In this embodiment, the display screen 2 further comprises a power module 4' seperably disposed on the box 3' and comprising a shell 40 and a first power unit 42 received in the shell 40, and the first power unit 42 is electrically connected to all the display modules 1 and used for converting AC power into DC power to realize power supply.

The power module 4' is separably assembled on the box 3', thus being easy to change and maintain and realizing pre-maintenance and post-maintenance.

In this embodiment, a bump 46 is disposed at one end of the shell 40, a receiving groove 34' corresponding to the bump 46 is formed in the box 3', and the bump 46 is received in the receiving groove 34'. The power module 4' further comprises a lock rod 42, a clamping hole 30' corresponding to the lock rod 42 is formed in the box 3', and the lock rod 42 penetrates through the other end of the shell 40 to be inserted into the clamping hole 30' and is in snap-fit with the clamping hole 30'.

When the lock rod 42 is in snap-fit with the clamping hole 30', the power module 4' is installed on the box 3'. When the lock rod 42 disengages from the clamping hole 30', the lock rod 42 can be taken out of the clamping hole 30', the bump 46 is moved out of the receiving groove 34', and the power module 4' is separated from the box 3'.

In case where each display module 1 is not provided with a power supply, the first power unit 4 converts 220V AC power into 4.5V DC power and outputs the 4.5V DC power to the power interfaces 124. In case where each display module 1 is provided with the first module power supply 17, the first power unit 4 converts 220V AC power into 48V DC power and outputs the 48V DC power to the DC power terminals 170.

In this embodiment, multiple magnetic assemblies 32 are disposed on the box 3', each magnetic assembly 32 corresponds to one magnet assembly 14 on one display module 1, and the four magnet assemblies 14 on each display module 1 are attracted to four magnetic assemblies 32 on the box 3', so that the display module 1 is installed in the box 3'. The magnetic assemblies 32 include magnets.

Figure 23:
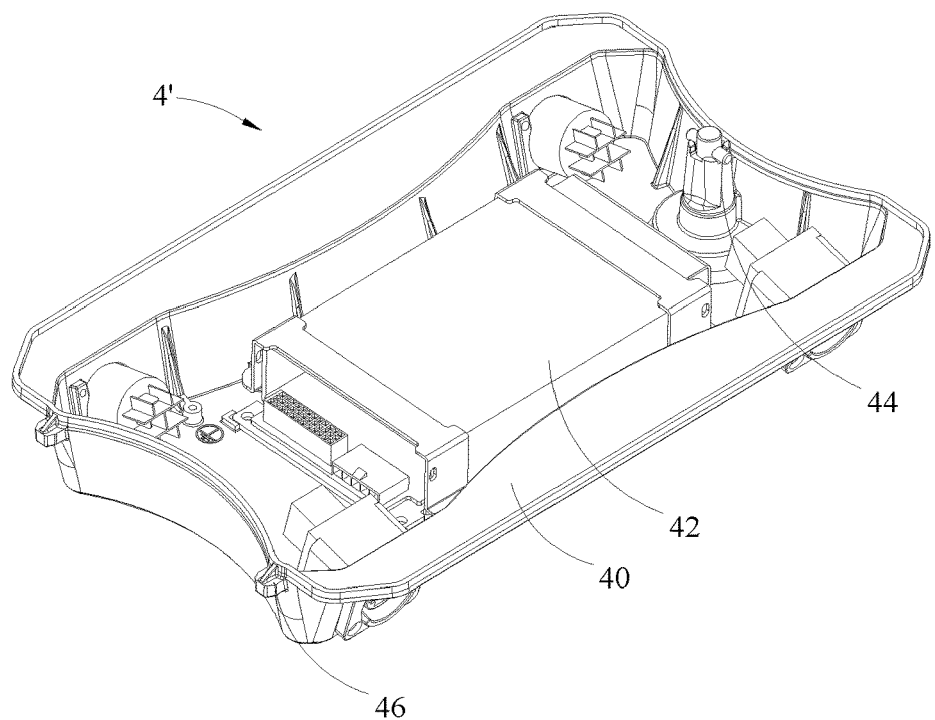
FIG. 23 is a structural view of a power module of the display screen in FIG. 19.
Figure 24A:
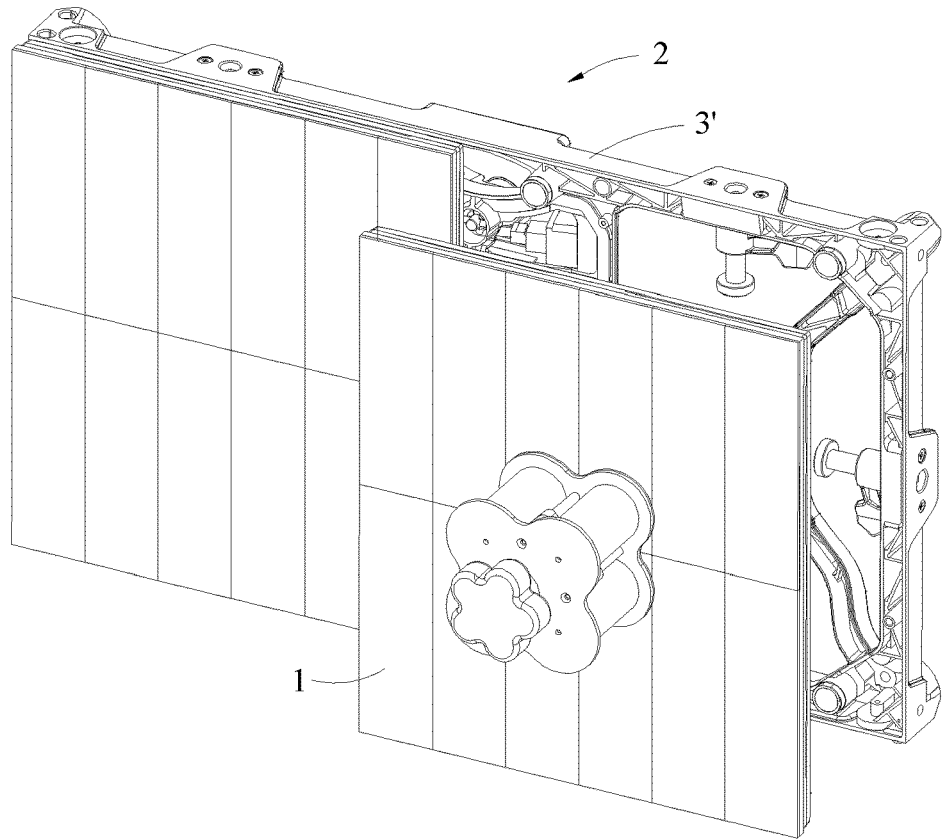
Figure 24B:
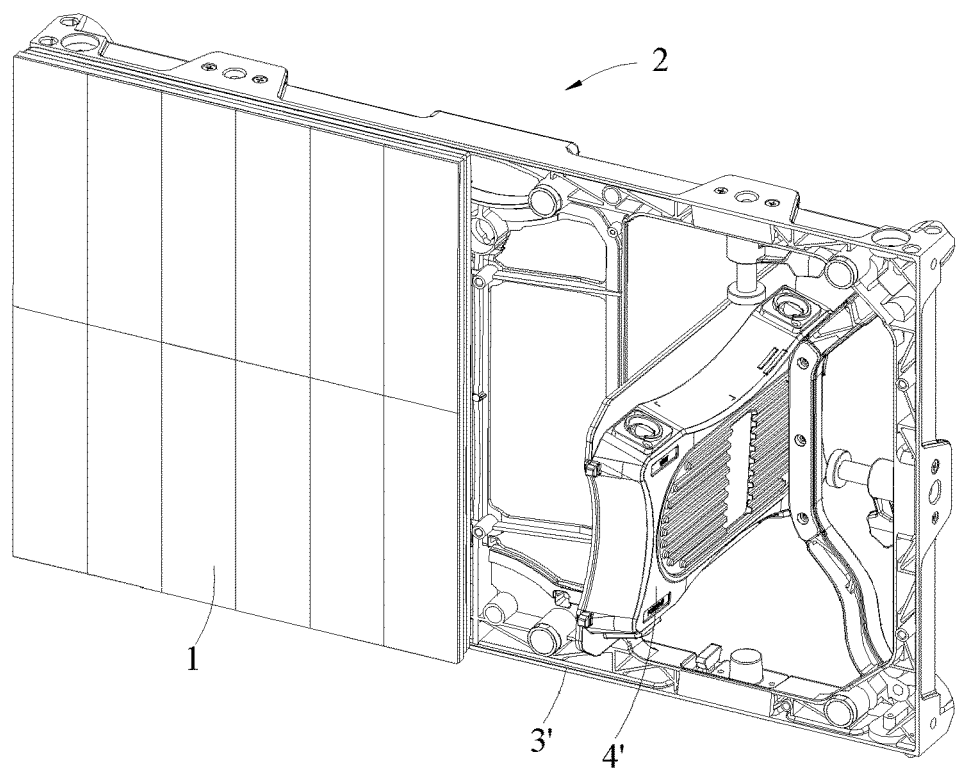

Referring to FIG. 23 and FIG. 24a-24b which are pre-maintenance diagrams of the display screen of the invention, a pre-maintenance tool is used to magnetically attract the display module 1 to separate the display module 1 from the box 3', and thus, pre-maintenance of the display module 1 is realized; next, the display module 1 penetrates through a frame of the box 3' from the front of the display screen 2, the lock rod 42 is rotated to be unlocked from the clamping hole 30', and the power module 4' is separated from the box 3'; and finally, the power module 4' is move behind the display screen 2 to penetrate through the frame of the box 3', so that pre-maintenance of the power module 4 is realized.

Referring to FIG. 25a-FIG. 25b which are post-maintenance diagrams of the display screen of the invention, the lock rod 42 is rotated to be unlocked from the clamping hole 30', and the power module 4' is separated from the box 3', so that post-maintenance of the power module 4' is realized; the display module 1 is pushed behind the display screen 2 to move forwards to be separated from the box 3', and then the display module 1 is rotated and is moved in front of the display screen 2 to penetrate through the frame of the box 3', so that post-maintenance of the display module 1 is realized.

Figure 21:
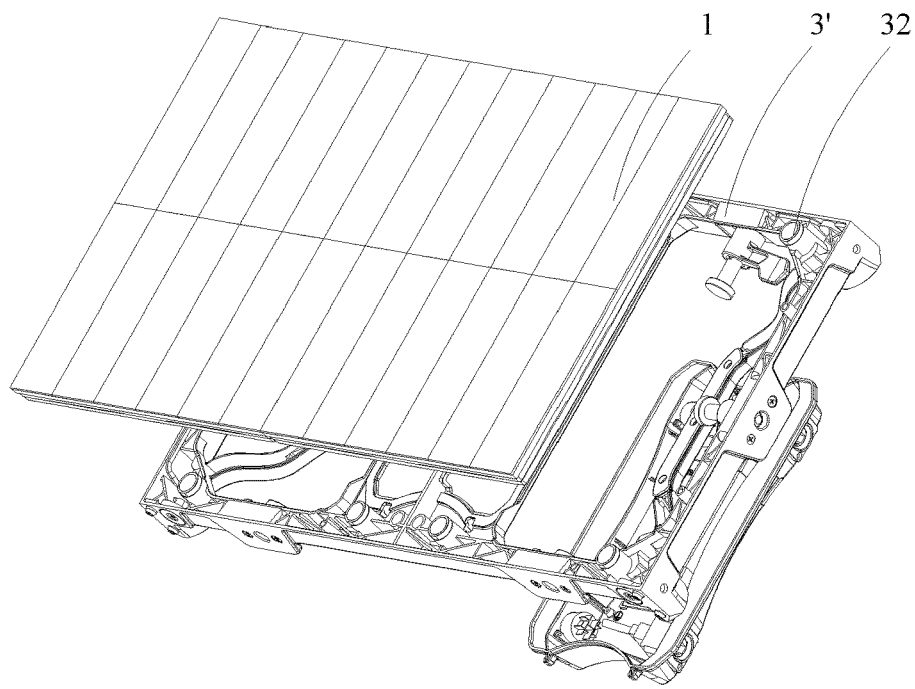
FIG. 21 is an exploded view of the display screen in FIG. 19.
Figure 22:
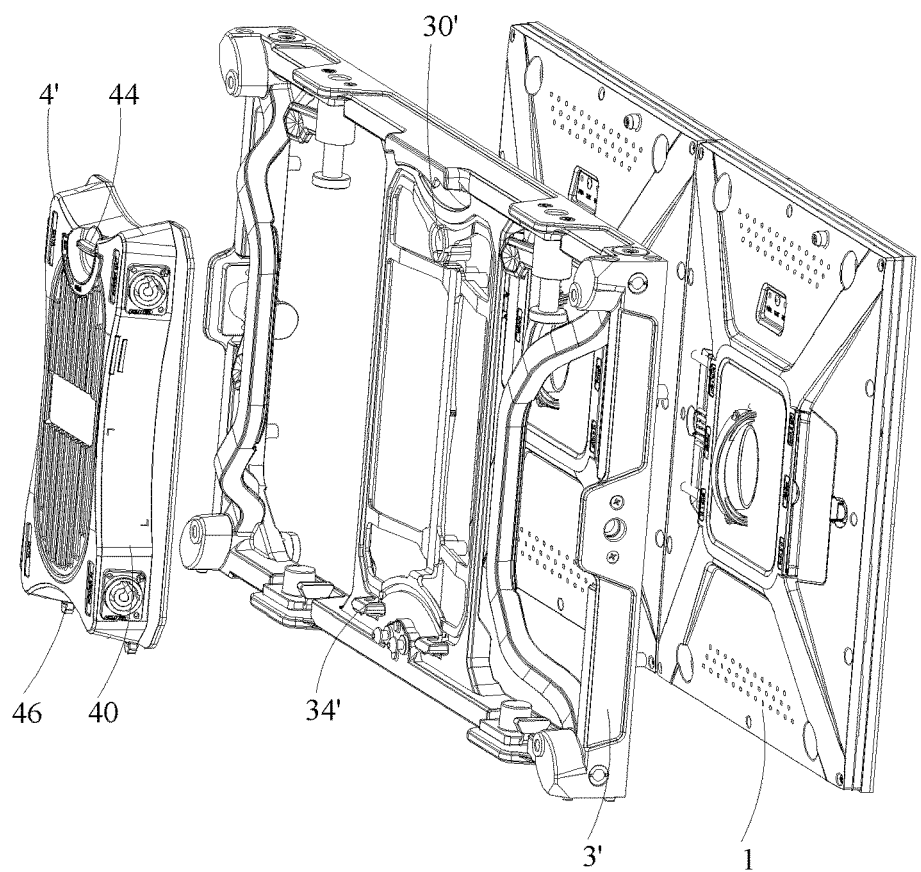
FIG. 22 is an exploded view of the display screen in FIG. 20.

The invention further provides a sixth embodiment of the display screen. Referring to FIG. 21 to FIG. 23, the display screen in the sixth embodiment is improved as follows on the basis of the fifth embodiment:

The display screen 2 further comprises a second power unit 5 (not shown) received in the shell 40. The second power unit 5 is electrically connected to all the display modules 1 and is used for converting AC power into DC power to realize power supply.

In this embodiment, the display screen 2 is additionally provided with the second power unit 5, which means that the first power unit 4 and the second power unit 5 supply power to all the display modules 1 at the same time, so that when the first power unit 4 or the second power unit 5 cannot operate, the other normal power unit can still supply power to the display modules to guarantee normal operation of the display screen 2. For example, in case where the operating current of one display module 1 is 30 A, the first power unit 4 and the second power unit 5 supply power to the display module 1 synchronously and each provide a 15 A current; when the first power unit 4 cannot operate, the second power unit 5 separately provides a 30 A current for the display module 1 to guarantee normal operation of the display module 1.

The invention further provides a seventh embodiment of the display screen. This embodiment of the display screen differs from the fifth embodiment or the sixth embodiment in the following aspects:

No power supply 4 is disposed on the box 3', and each display module 1 is directly connected to a power supply outside the display screen 2. In case where the display modules 1 in the ninth embodiment or the tenth embodiment are adopted, 48V DC power is directly input from the outside of the display screen 2, such as from a distribution box. In case where the display modules 1 in the eleventh embodiment are adopted, 220V AC power is directly input from the outside of the display screen, that is, each display module 1 is directly accessed to a mains supply.

The invention further provides an eighth embodiment of the display screen. This embodiment of the display screen differs from all the above-mentioned embodiments in the following aspects:

Each display module 1 of the display screen 2 in this embodiment is the display module 1 in the twelfth embodiment, that is, the display unit boards 11 of the display module 11 are of a lamp-driver separated structure instead of a lamp-driver integrated structure in other embodiments.

The invention further provides a display system. As shown in FIG. 26, in one embodiment, the display system comprises a support 6 and display screens 2 installed on the support 6. The specific structure of the display screens 2 can be understood with reference to the above-mentioned embodiments. Because the display system in this embodiment adopts all technical solution of all the above-mentioned embodiments, it has all the beneficial effects fulfilled by these embodiments, and details will not be given anymore. It should be noted that the number of the display screens 2 in the invention can be set as actually needed, and may be, but not limited to, 2, 4, 6, 8 or more.

In this embodiment, multiple connecting pieces 60 are disposed on the support 6, and each connecting piece 60 can move vertically on the support 6 to be adjusted to and fixed at an appropriate position and is connected to a corner of the back side of the bottom case 3 of an adjacent display screen 2 with screws, so that the display screens 2 are assembled on the support 6.

The aforesaid embodiments are merely preferred ones of the invention, and are not intended to limit the patent scope of the invention. All equivalent structural transformations made according to the contents of the specification and the accompanying drawings of the invention, or direct/indirect applications to other relating technical fields without departing from the conception of the invention should also fall within the patent protection scope of the invention.

What is claimed is:

1. A display module, comprising:
a frame comprising a border and a support frame installed in the border; and
multiple display unit boards assembled and installed on the frame to a display surface;
each said display unit board comprising:
a circuit board having a front side installed on the border and the support frame, and a back side; and
multiple pixel points installed on the front side and each including at least one LED chip; and
multiple magnet assemblies, wherein multiple installation grooves are formed in a side, away from the display unit boards, of the support frame, and each said magnet assembly is separably installed in one said installation groove.

2. The display module according to claim 1, wherein the support frame is of a criss-cross structure and coordinates with the border to form multiple installation frames, and a periphery of the circuit board of each said display unit board is bonded to one said installation frame.

3. The display module according to claim 1, wherein each said display unit board further comprises a packaging layer which covers the circuit board to package the multiple pixel points, wherein:
the packaging layer is formed with multiple vertical and horizontal trenches which divide the packaging layer into multiple lens parts spaced apart from one another, every two adjacent said pixel points are spaced apart from each other by one said trench, and each said lens part corresponds to one said pixel point; or
wherein each said horizontal trench is disposed between two adjacent said pixel points; or
each said vertical trench is disposed between two adjacent said pixel points.

4. A display screen, comprising a bottom case and display modules installed in the bottom case, wherein the display modules are assembled to form a display surface, and each said display module is the display module according to claim 1.

5. The display screen according to claim 4, wherein:
a first through hole is formed in one side of the bottom case, a second through hole is formed in another side of the bottom case, and the first through hole is opposite to the second through hole;
the display screen further comprises a first assembly connector and a second assembly connector used for data and power transmission, the first assembly connector is installed in the bottom case and realizes connection via the first through hole, and the second assembly connector is installed in the bottom case and realizes connection via the second through hole;
the first assembly connector of one display screen is connected to the second assembly connector of another adjacent display screen in a plugged manner.

6. The display module according to claim 4, wherein each said display unit board further comprises a packaging layer which covers the circuit board to package the multiple pixel points, wherein:
the packaging layer is formed with multiple vertical and horizontal trenches which divide the packaging layer into multiple lens parts spaced apart from one another, every two adjacent said pixel points are spaced apart from each other by one said trench, and each said lens part corresponds to one said pixel point;
wherein each said horizontal trench is disposed between two adjacent said pixel points; or
each said vertical trench is disposed between two adjacent said pixel points.

7. The display module according to claim 4, wherein the support frame is of a criss-cross structure and coordinates with the border to form multiple installation frames, and a periphery of the circuit board of each said display unit board is bonded to one said installation frame.

8. A display system, comprising a support and a plural number of display screens according to claim 4 installed on the support, the display screens being assembled to form a display surface.

9. A display module, comprising:
multiple display unit boards arranged in sequence, a frame and a back cover, and multiple magnet assembiles;
wherein the multiple display unit boards are assembled and installed on the frame to form a display surface, and the frame is installed on the back cover;
the frame comprises a border and a support frame installed in the border;
each said display unit board comprises a circuit board and multiple pixel points installed on a front side of the circuit board, wherein a back side of the circuit board is installed on the border and the support frame, and each said pixel point includes at least one LED chip; and
multiple installation grooves are formed in a side, away from the display unit boards, of the support frame and are close to different corners of the border;
each said magnet assembly is separably installed in one said installation groove.

10. The display module according to claim 9, wherein the support frame is of a criss-cross structure and coordinates with the border to form multiple installation frames, and a periphery of the circuit board of each said display unit board is bonded to one said installation frame.

11. The display module according to claim 9, wherein each said display unit board further comprises a packaging layer which covers the circuit board to package the multiple pixel points, wherein:
the packaging layer is formed with multiple vertical and horizontal trenches which divide the packaging layer into multiple lens parts spaced apart from one another, every two adjacent said pixel points are spaced apart from each other by one said trench, and each said lens part corresponds to one said pixel point;

wherein each said horizontal trench is disposed between two adjacent said pixel points; or each said vertical trench is disposed between two adjacent said pixel points.

12. A display screen, comprising a box and display modules installed on the box, wherein the display modules are assembled to form a display surface, and each said display module is the display module according to claim 9.

13. The display screen according to claim 12, further comprising a power module separably installed on the box, wherein the power module comprises a shell and a first power unit received in the shell, the first power unit is electrically connected to all the display modules and is used for converting AC power into DC power to realize power supply.

14. The display screen according to claim 13, wherein:

a bump is disposed at one end of the shell, a receiving groove corresponding to the bump is formed in the box, and the bump is received in the receiving groove;

the power module further comprises a lock rod, a clamping hole corresponding to the lock rod is disposed on the box, and another end of the lock rod penetrates through the shell to be inserted into the clamping hole and is snap-fit with the clamping hole.

15. The display screen according to claim 13, wherein the power module further comprises a second power unit received in the shell, and the second power unit is electrically connected to all the display modules and is used for converting AC power into DC power to realize power supply.

16. A display system, comprising a support and display screens installed on the support, the display screens being assembled to form a first display surface, wherein each said display screen comprises a box and display modules installed on the box, wherein the display modules are assembled to form a second display surface, each said display module comprises multiple display unit boards arranged in sequence, a frame and a back cover, wherein the display unit boards are assembled and installed on the frame to form the second display surface, and the frame is installed on the back cover;

a power module separably installed on the box, wherein the power module comprises:

a shell and a power unit received in the shell, the power unit is electrically connected to all of the display modules and is used for converting AC power into DC power to realize a power supply; and a lock rod, a clamping hole corresponding to the lock rod is disposed on the box, and another end of the lock rod penetrates through the shell to be inserted into the clamping hole and is snap-fit with the clamping hole; and a bump disposed at one end of the shell, a receiving groove corresponding to the bump is formed in the box, and the bump is received in the receiving groove;

the frame comprises a border and a support frame installed in the border;

each said display unit board comprises a circuit board and multiple pixel points installed on a front side of the circuit board, wherein a back side of the circuit board is installed on the border and the support frame, and each said pixel point includes at least one LED chip.

\* \* \* \* \*